United States Patent
Salmon

(10) Patent No.: US 8,581,407 B2
(45) Date of Patent: Nov. 12, 2013

(54) ELECTRONIC SYSTEM MODULES AND METHOD OF FABRICATION

(75) Inventor: Peter C. Salmon, Mountain View, CA (US)

(73) Assignee: SK hynix Inc., Ichon-si (KR)

( * ) Notice: Subject to any disclaimer, the term of this patent is extended or adjusted under 35 U.S.C. 154(b) by 192 days.

(21) Appl. No.: 12/414,502

(22) Filed: Mar. 30, 2009

(65) Prior Publication Data

US 2009/0243076 A1    Oct. 1, 2009

Related U.S. Application Data

(62) Division of application No. 11/066,964, filed on Feb. 25, 2005, now abandoned, which is a division of application No. 10/237,640, filed on Sep. 6, 2002, now Pat. No. 6,927,471.

(60) Provisional application No. 60/318,271, filed on Sep. 7, 2001.

(51) Int. Cl.
*H01L 23/485* (2006.01)

(52) U.S. Cl.
USPC ........... 257/758; 257/734; 257/774; 257/786; 257/E23.02; 257/E23.151

(58) Field of Classification Search
USPC ................ 257/734, 758, 773, 774, 781, 786, 257/E23.011, E23.015, E23.019, E23.02, 257/E23.142, E23.151, E23.173, E23.175
See application file for complete search history.

(56) References Cited

U.S. PATENT DOCUMENTS

| | | |
|---|---|---|
| 4,672,421 A | 6/1987 | Lin |
| 4,767,189 A | 8/1988 | Hayashi et al. |

(Continued)

FOREIGN PATENT DOCUMENTS

| | | |
|---|---|---|
| EP | 1089331 A2 | 4/2001 |
| JP | 7169873 A | 7/1995 |

(Continued)

OTHER PUBLICATIONS

Davis et al., "Thin Film Metallization of Three Dimensional Substrates," May 1-4, 1994, Electronic Components Technology Conference, Proceedings 44th, pp. 359-361.

(Continued)

*Primary Examiner* — Eduardo A Rodela
(74) *Attorney, Agent, or Firm* — Kilpatrick Townsend & Stockton LLP

(57) ABSTRACT

This specification describes techniques for manufacturing an electronic system module. The module includes flexible multi-layer interconnection circuits with trace widths of 5 microns or less. A glass panel manufacturing facility, similar to those employed for making liquid crystal display, LCD, panels is used to fabricate the interconnection circuits. A polymer base layer is formed on a glass carrier with an intermediate release layer. Alternate layers of metal and dielectric are formed on the base layer, and patterned to create an array of multi-layer interconnection circuits on the glass panel. A thick layer of polymer is deposited on the interconnection circuit, and openings formed at input/output (I/O) pad locations. Solder paste is deposited in the openings to form wells filled with solder. After dicing the glass carrier to form separated interconnection circuits, IC chips are stud bumped and assembled using flip chip bonding, wherein the stud bumps on the components are inserted into corresponding wells on the interconnection circuits. The IC chips are tested and reworked to form tested circuit assemblies. Methods for connecting to testers and to other modules and electronic systems are described. Module packaging layers are provided for hermetic sealing and for electromagnetic shielding. A blade server embodiment is also described.

17 Claims, 17 Drawing Sheets

(56) References Cited

U.S. PATENT DOCUMENTS

| | | | |
|---|---|---|---|
| 4,862,322 A | 8/1989 | Bickford et al. | |
| 5,024,372 A | 6/1991 | Altman et al. | |
| 5,074,947 A | 12/1991 | Estes et al. | |
| 5,103,290 A | 4/1992 | Temple et al. | |
| 5,214,250 A | 5/1993 | Cayson et al. | |
| 5,267,867 A | 12/1993 | Agahdel et al. | |
| 5,290,970 A | 3/1994 | Currie | |
| 5,367,593 A | 11/1994 | Lebby et al. | |
| 5,382,545 A | 1/1995 | Hong | |
| 5,404,175 A | 4/1995 | Nagae et al. | |
| 5,432,675 A * | 7/1995 | Sorimachi et al. | 361/719 |
| 5,534,465 A | 7/1996 | Frye et al. | |
| 5,534,466 A | 7/1996 | Perfecto et al. | |
| 5,550,083 A | 8/1996 | Koide et al. | |
| 5,561,327 A * | 10/1996 | Jun | 257/758 |
| 5,579,574 A | 12/1996 | Colleran et al. | |
| 5,627,406 A | 5/1997 | Pace | |
| 5,628,852 A * | 5/1997 | Ishida | 156/182 |
| 5,662,987 A * | 9/1997 | Mizumoto et al. | 428/209 |
| 5,700,737 A | 12/1997 | Yu et al. | |
| 5,708,566 A | 1/1998 | Hunninghaus et al. | |
| 5,719,749 A | 2/1998 | Stopperan | |
| 5,729,435 A | 3/1998 | Iijima et al. | |
| 5,760,650 A | 6/1998 | Faulkner et al. | |
| 5,800,650 A | 9/1998 | Anderson et al. | |
| 5,841,193 A | 11/1998 | Eichelberger | |
| 5,912,510 A | 6/1999 | Hwang et al. | |
| 5,918,364 A | 7/1999 | Kulesza et al. | |
| 5,972,152 A | 10/1999 | Lake et al. | |
| 5,998,738 A | 12/1999 | Li et al. | |
| 6,103,554 A | 8/2000 | Son et al. | |
| 6,138,348 A | 10/2000 | Kulesza et al. | |
| 6,141,245 A | 10/2000 | Bertin et al. | |
| 6,174,804 B1 | 1/2001 | Hsu | |
| 6,175,161 B1 | 1/2001 | Goetz et al. | |
| 6,180,687 B1 | 1/2001 | Hammer et al. | |
| 6,180,867 B1 | 1/2001 | Hedengren et al. | |
| 6,246,010 B1 | 6/2001 | Zenner et al. | |
| 6,329,610 B1 | 12/2001 | Takubo et al. | |
| 6,372,549 B2 | 4/2002 | Urushima | |
| 6,515,870 B1 | 2/2003 | Skinner et al. | |
| 6,528,891 B2 | 3/2003 | Lin | |
| 6,664,176 B2 | 12/2003 | Hedler et al. | |
| 6,846,737 B1 | 1/2005 | Towle et al. | |
| 6,881,609 B2 | 4/2005 | Salmon | |
| 6,927,471 B2 | 8/2005 | Salmon | |
| 7,297,572 B2 | 11/2007 | Salmon | |
| 2001/0020549 A1 | 9/2001 | Horiuchi et al. | |
| 2001/0026010 A1 | 10/2001 | Horiuchi et al. | |
| 2001/0046586 A1 | 11/2001 | Chan et al. | |
| 2002/0151164 A1 | 10/2002 | Jiang et al. | |
| 2003/0132529 A1 | 7/2003 | Yeo et al. | |
| 2003/0148558 A1 | 8/2003 | Kubo et al. | |
| 2004/0092141 A1 | 5/2004 | Salmon | |

FOREIGN PATENT DOCUMENTS

| | | |
|---|---|---|
| WO | WO 9109419 A1 | 6/1991 |
| WO | WO 9307378 A1 | 4/1992 |
| WO | WO 9505675 A1 | 2/1995 |

OTHER PUBLICATIONS

Requirement for Restriction/Election for U.S. Appl. No. 10/237,640, mailed Jun. 15, 2004, 5 pages.
Response to Requirement for Restriction/Election for U.S. Appl. No. 10/237,640, Received by the USPTO on Jul. 12, 2004, 2 pages.
Non-Final Office Action for U.S. Appl. No. 10/237,640, mailed Oct. 5, 2004, 12 pages.
Response to Non-Final Office Action Received by the USPTO on Jan. 24, 2005 for U.S. Appl. No. 10/237,640, 14 pages.
Notice of Allowance for U.S. Appl. No. 10/237,640, mailed Apr. 15, 2005, 8 pages.
Non-Final Office Action for U.S. Appl. No. 10/701,888, mailed May 21, 2004, 8 pages.
Response to Non-Final Office Action Received by the USPTO on Aug. 30, 2004 for U.S. Appl. No. 10/701,888, 9 pages.
Notice of Allowance for U.S. Appl. No. 10/701,888, mailed Dec. 9, 2004, 6 pages.
Restriction Requirement for U.S. Appl. No. 10/702,235, mailed Jun. 28, 2005, 7 pages.
Response to Restriction Requirement/Election for U.S. Appl. No. 10/702,235 Received by the USPTO on Aug. 5, 2005, 14 pages.
Non-Final Office Action for U.S. Appl. No. 10/702,235, mailed Oct. 3, 2005, 9 pages.
Response to Non-Final Office Action for U.S. Appl. No. 10/702,235, Received by the USPTO on Apr. 7, 2006, 13 pages.
Non-Final Office Action for U.S. Appl. No. 10/702,235, mailed Dec. 15, 2006, 9 pages.
Response to Non-Final Office Action for U.S. Appl. No. 10/702,235, Received by the USPTO on Jun. 15, 2007, 11 pages.
Notice of Allowance for U.S. Appl. No. 10/702,235, mailed Jul. 24, 2007, 9 pages.
Restriction Requirement for U.S. Appl. No. 11/066,964, mailed Mar. 30, 2006, 6 pages.
Response to Restriction Requirement for U.S. Appl. No. 11/066,964, Received by the USPTO on Apr. 17, 2006, 4 pages.
Requirement for Restriction/Election for U.S. Appl. No. 11/066,964, mailed Jun. 30, 2006, 8 pages.
Response to Requirement for Restriction/Election for U.S. Appl. No. 11/066,964, Received by the USPTO on Nov. 2, 2006, 5 pages.
Notice of Non-Complaint Amendment for U.S. Appl. No. 11/066,964, mailed Jan. 30, 2007, 4 page.
Response to Notice of Non-Complaint Amendment for U.S. Appl. No. 11/006,964, Received by the USPTO on Mar. 9, 2007, 7 pages.
Requirement for Restriction/Election for U.S. Appl. No. 11/066,964, mailed Jun. 5, 2007, 7 pages.
Response to Requirement for Restriction/Election for U.S. Appl. No. 11/066,964, Received by the USPTO on Jul. 16, 2007, 6 pages.
Non-Final Office Action for U.S. Appl. No. 11/066,964, mailed Oct. 9, 2007, 15 pages.
Response to Non-Final Office Action for U.S. Appl. No. 11/066,964, Received by the USPTO on Mar. 28, 2008, 12 pages.
Final Office Action for U.S. Appl. No. 11/066,964, mailed Jul. 8, 2008, 9 pages.
Response to Final Office Action for U.S. Appl. No. 11/066,964, Received by the USPTO on Sep. 17, 2008, 8 pages.
Non-Final Office Action for U.S. Appl. No. 11/066,964, mailed Oct. 30, 2008, 5 pages.
Non-Final Office Action for U.S. Appl. No. 11/769,321, mailed Jan. 26, 2009, 13 pages.
Response to Non-Final Office Action for U.S. Appl. No. 11/769,321, Received by the USPTO on Apr. 16, 2009, 10 pages.
Requirement for Restriction/Election for U.S. Appl. No. 11/868,912, mailed Mar. 13, 2009, 7 pages.
Response to Requirement for Restriction/Election for U.S. Appl. No. 11/868,912, mailed Apr. 10, 2009, 8 pages.
Non-Final Office Action for U.S. Appl. No. 11/868,912 mailed Jun. 18, 2009, 16 pages.
Requirement for Restriction/Election for U.S. Appl. 11/868,919, mailed Feb. 4, 2009, 13 pages.
Response to Requirement for Restriction/Election for U.S. Appl. 11/868,919, Received by the USPTO on Mar. 3, 2009, 11 pages.
Non-Final Office Action for U.S. Appl. No. 11/868,919, mailed Apr. 28, 2009, 32 pages.

* cited by examiner

ELECTRONIC SYSTEM MODULES AND METHOD OF FABRICATION

RELATED APPLICATIONS

This application is division of U.S. application Ser. No. 11/066,964, filed Feb. 25, 2005, which is a division of U.S. application Ser. No. 10/237,640, filed Sep. 6, 2002, (now U.S. Pat. No. 6,927,471, issued Aug. 9, 2005), which claims priority to U.S. Provisional Application No. 60/318,271, filed Sep. 7, 2001, the contents of all of which are incorporated herein by reference in their entirety.

BACKGROUND OF THE INVENTION

1. Field of the Invention

This invention relates generally to an electronic system module and method of fabrication, and more particularly to an electronic system module fabricated on a carrier from which it can be released.

2. Description of the Related Art

The number of input/output (I/O) connections required by integrated circuit (IC) chips is increasing, to several hundred for recent microprocessor chips. As verification of complex designs becomes an increasing portion of the total design activity, it is desirable to increase the I/O count further, to provide access to more internal nodes for testing. Flip chip assembly methods have helped to provide more I/O connections because they provide an area array of connections across the entire face of an IC chip, rather than just at the perimeter as with wire bonding. However, it continues to be desirable to reduce the pad pitch, the distance between bonding pad centers, in order to achieve more I/O connections per unit area of IC chip.

A recent advance in flip chip assembly capability has been the introduction of stud bumping machines that can provide gold stud bumps on IC chips with pad pitches of less than 100 microns. However, to take advantage of this capability, the system board that receives the bumped devices must have fine traces in order to route all of the signals with space efficiency, and to support bonding pitches less than 100 microns. The most recent packaging technology to be commercially introduced is called land grid array, LGA. It builds up the wiring layers by plating a base layer of copper that has been patterned with photo resist. The external terminal pitch claimed for this packaging method is "less than 0.5 mm". None of the available printed circuit board technologies can support direct mounting of bumped devices at a pitch of 100 microns or less. The current invention is capable of pad pitches of less than 100 microns, including a viable method for reworking defective IC chips at this bonding density.

For many years the minimum trace width available from printed circuit board vendors has been around 100 microns. Recently, advanced multi-layer circuit processes have achieved trace widths of 17 microns. The current invention is capable of achieving trace widths of 5 microns or less, together with a trace pitch of 10 microns or less.

One way to achieve fine line interconnection circuits is to employ a semiconductor fabrication facility and to build the interconnection circuit on a silicon wafer; hence the term, wafer level packaging, WLP. The precision of the associated photolithographic methods, the clean room environment with low particulate count, and the advanced substrate handling equipment of such a facility can all contribute to high-density interconnection circuits. However, the application of IC chip manufacturing facilities to this problem is more than what is required. An intermediate alternative is to apply the manufacturing resources of a glass-panel fabrication facility, where the minimum feature sizes are 10 to 20 times larger than for IC chips (but still adequate for the most advanced assembly processes), and the manufacturing cost per unit area of devices produced is less than 5% of the cost per unit area of IC chips. In addition, the glass panel fabrication facility can produce system boards of any size up to approximately a meter square, whereas the largest wafers produced have a diameter of 300 mm. In order to avoid the rigidity and weight of the glass substrate, and to provide better thermal access to the heat producing components for cooling them, it is desirable to discard the glass carrier after most of the processing is done.

Typically, WLP has used redistribution circuits to map from the fine pitch available with flip chip bonding to the coarser pitch of a printed circuit board. The current invention eliminates the redistribution circuits because the printed circuits produced (termed interconnection circuits) include fine features that easily accommodate the fine pitch of the flip chip bonding.

It has been common practice to produce printed circuit boards at one facility, and perform system assembly and test at another facility. However, there are major advantages to integrating the circuit board manufacturing process with the assembly and test process to create a single, unified, fabrication, assembly, and test process. One advantage is in reducing the time to develop and debug a new design. Flexibility in the proposed process allows adaptation to component and assembly yield problems as they arise (as each additional component is assembled), providing more detailed testing sequences as necessary. For example, during prototype testing, components may be assembled onto the circuit substrate one at a time, providing a test environment of a partial system, and making the minimum change of a single IC chip between one test and the next. The test software can be adapted to address detailed issues as they arise. Once confidence has been achieved at this level, components may be assembled and tested in functional groups as the product moves into production. A tighter integration of personnel is also achieved because all of the variables are controlled in one place. This flexibility, wherein the assembly process is tailored to yield issues in real time, is not available with conventional testing methods. Usually, an entire system is assembled before any system testing is performed. The current invention employs incremental system level testing, as each component is attached to the circuit assembly. The testing of each component is performed fewer times, because the incremental assembly and test process essentially guarantees system integrity at each step. This contrasts with conventional methods requiring component test, sub-assembly test, and system test, with numerous iterations if problems develop.

More accurate and complete testing of components is provided when they are tested in their system environment, rather than individually. The system environment is created with the actual system, or a subset thereof, rather than a simulated environment created by test vectors programmed into a general-purpose tester. This can lead to lower test cost and faster test development, by eliminating the need to generate and debug detailed system response patterns. If the system level requirements are satisfactorily met, then the minutiae of component level characteristics become irrelevant. Alternatively, only the functions relevant to proper system function are tested; this is a much more manageable set of requirements than the total set of functions that all the assembled components are capable of performing.

The signal voltage swing is reducing with each new generation of IC chip technology. This makes it more difficult to test remotely through a cable, and still achieve the necessary noise margins. Providing test chips on the motherboard will provide shorter trace lengths for testing, which will be more robust with respect to both timing issues and noise margin.

Each component may be verified at an elevated system temperature before attaching the next component. This can be accomplished by heating the glass carrier underneath the circuit assembly. By providing a pre-determined test temperature to the entire circuit assembly, a speed grade can be associated with the module, as has been done in the past at the component level. Greater emphasis can be placed on environmental stress testing at the system level. Also accelerated life testing can be performed early in the life cycle of a product, and lessons learned about particular components can be incorporated into the system level test. The only tests performed on each component correspond to system level requirements; by not testing component requirements that are irrelevant to the particular system, higher system yields may be achievable.

The physical structure of the system module of the current invention can lead to other conveniences. An example relates to accelerated life testing of a module. Because the current invention allows a sophisticated system (circuit assembly) to be implemented in a module of small size, and because the system module packaging includes a metal envelope surrounding the module that provides good heat distribution, temperature control can be achieved by placing the module on a hot plate rather than in a bulky and inaccessible environmental chamber.

Hermetic packaging techniques and electromagnetic shielding techniques can be applied at the module level to improve both performance and manufacturing cost. Performance is improved because a single metal envelope encloses almost the entire module, avoiding the interference from individual components and the wiring between them. Cost is reduced because hermeticity and shielding are provided with a simple process applied once to the entire system, rather than being addressed individually at each of the components.

Such a unified process has only recently become feasible. It depends on using common semiconductor manufacturing equipment to support fabrication of the interconnection circuits, bonding sites, test connection fixtures, module cables, and the module layers that create hermeticity and electromagnetic shielding. It also depends on the fact that sophisticated and programmable IC chips can now implement the testing function across all of the components in a system, including digital, analog, and RF functions, if multiple IC chips are employed for testing. Adding these functions to the system using the current invention is not as expensive as in the past, because the packaging and assembly cost is minimal. Preferably, a tester is included with every module produced, but the cost of the tester is small compared with the system level assembly and performance benefits, and the reduction in system development time.

R. K. Traeger, "Hermeticity of Polymeric Lid Sealants", Proc. 25th Electronics Components Conf., 1976, p. 361, has documented the water permeabilities of silicones, epoxies, fluorocarbons, glasses and metals. Traeger's data shows that, in terms of providing a barrier to water, a layer of metal that is 1 micron thick is approximately equivalent to a layer of glass that is 1 mm thick, and also equivalent to a layer of epoxy that is 100 cm thick.

Generally flip chip bonding techniques require an epoxy under-layer between flip chip mounted IC chips and the circuit board. The purpose of the under-layer is to provide mechanical strength to withstand repeated thermal cycling without developing cracks in the area of the flip chip bonds. The thermal stress arises because of the difference in thermal coefficients of expansion (TCEs) between the IC chip material and the board material. Gelatinized solvents have typically been used to dissolve the epoxy; they leave a residue that must be cleaned off. The process of cleaning off the residue has typically resulted in damage to the fine pitch bonding sites, to the point where they cannot be reliably re-bonded. The under-layer is unnecessary with the current invention because the flexibility of the final interconnection circuit substantially eliminates thermally induced stress in the region of the flip chip bonds. Without the thermally induced stress, no cracking will occur. Thermal stresses are still present during assembly (because the interconnection circuit is rigid at this point), but are avoided during operation in the field (when the interconnection circuit is flexible). The number and extent of thermal cycles during assembly are more predictable and controllable than the thermal cycles arising from operation in the field. Stress testing in the laboratory can be used to quantify the acceptable temperature limits, and assure crack-free circuit assemblies. Avoiding the under-layer makes a robust rework process possible. This general concept is referred to in the art as compliant packaging technology. A related issue is the recent requirement for low stress in IC chips that use ultra-low-k dielectric materials. IC chips attached to flexible substrates will experience low stress and will be accommodating of the ultra-low-k dielectrics.

SUMMARY OF THE INVENTION

A glass substrate for 5th generation fabrication of LCD circuits is typically 1100 by 1250 mm in area, and 1.1 mm thick, which can be used in carrying out the present invention. However, the glass carrier of the current invention can be of any size. The unit manufacturing costs of interconnection circuits and related circuit assemblies of the current invention are lower if larger glass panels are used. The glass or other rigid carrier provides mechanical support for all of the fabrication, component assembly, test, and rework process steps, and also has excellent dimensional stability. This dimensional stability transfers to the multi-layer circuits that are built up as a series of films on top of the glass. This transferred dimensional stability is a primary reason that fine line features such as trace widths less than 5 microns are possible with the current invention. It is also important however, that the final version of the interconnection circuit be flexible, because the flexibility allows the use of epoxy under layers to be avoided, leading to more robust rework processes for removing and replacing defective chips. The flexibility also allows system boards to be folded in compact devices such as cellular phones.

A release agent is applied to a glass panel substrate, except for a clear region near the edges. The clear region is characterized by high adhesion between the glass and the polymer base layer to be subsequently formed on the glass. The high adhesion region provides an anchor that firmly attaches the polymer to the glass around the perimeter of the panel. The release layer creates low adhesion between glass and polymer, so that after a circuit assembly has been built on top, it can be readily peeled off.

Alternate layers of metal interconnect and dielectric such as a photo-definable polymer are built up on the base layer. Two-level contacts are formed between adjacent metal layers, and stacked contacts are provided between groups of adjacent layers. Preferably each input/output (I/O) pad of an assembled IC chip is a node of the multi-layer interconnection circuit. At the center of each I/O pad a stacked contact is created, with stubs at every metal layer, for convenient routing of traces. The base polymer layer, the dielectric layers and the metal layers are flexible, and when the multi-layer interconnection circuit is subsequently removed from the glass panel, it too is flexible. Attached IC chips are usually not flexible, but if a folding line on the interconnection circuit is kept clear of IC chips, then the circuit assembly can be folded at the folding line.

While the multi-layer interconnection circuit is still attached to the glass carrier, it is convenient to form wells filled with solder on the array of interconnection circuits, in large substrate form. Each well is designed to accept a stud bump of an attached component. Gold stud bumps are formed at I/O pads of all IC chips to be assembled. To create the wells a thick layer of polymer is applied on top of the interconnection circuit. Openings in this layer are formed at I/O pad bonding sites. The openings in the cured polymer layer form a mask, and solder paste is wiped over the mask to fill the openings, thus forming a well at each of the I/O bonding sites.

The glass carrier is diced with a diamond saw to separate individual circuit assemblies from one another, and provide a more convenient form for component assembly, test, and rework. The interconnection circuit itself must be tested, before any assembly is done. This test is performed using a test fixture that connects through a module access port to an external tester. The module access port may include I/O pads (module access pads) for every node of the multi-layer interconnection circuit. The assembly and rework steps require that IC chips and other surface mounted components are precisely located in order that the bonding tool can accurately align bonding sites on the components with corresponding bonding sites on the interconnection circuit. Accordingly, the circuit assembly remains attached to the glass carrier, and its dimensional accuracy is maintained until these steps are completed.

A module cable with high-density interconnections is attached to each circuit assembly. The circuit assemblies are then separated from their individual glass carriers by peeling the base substrate away from the carrier. Since the adhesion force is low in these regions, they can be separated without damage.

Additional metal coatings are applied to create a circuit module that is hermetically sealed and electro-magnetically shielded. To effectively cool the dense circuit module, it may be bonded to a heat sink, and the heat sink may be cooled with a circulating fluid.

It should be understood that for diagrammatic purposes the figures are not drawn to scale.

DESCRIPTION OF THE PREFERRED EMBODIMENTS

Figure 1A:
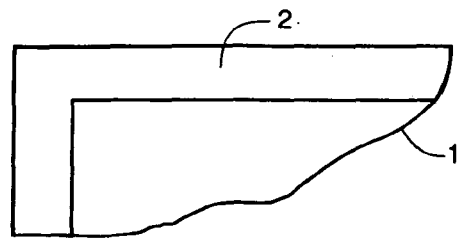
FIG. 1A-1C shows a corner fragment of a glass carrier in plan view, describing the process steps for creating a polymer base layer on a release layer.
Figure 1B:
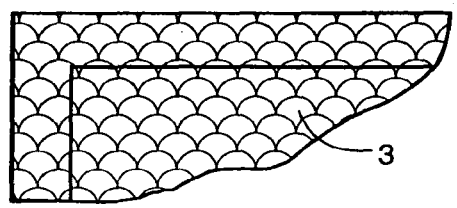
Figure 1C:
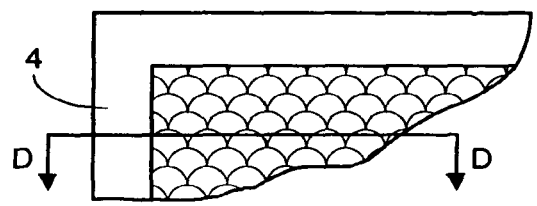
Figure 1D:
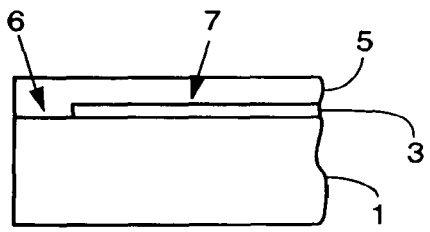
FIG. 1D is a cross-sectional view of section DD of FIG. 1C, and shows the base polymer layer in relation to the release layer.

FIG. 1A shows a corner fragment of a glass carrier 1. Photo resist has been patterned on the carrier, so that a border of resist, 2, having a width of approximately 20 mm, surrounds the perimeter. FIG. 1B shows that a film of release layer, 3, has been applied over the entire surface of the glass carrier. A suitable material for the release layer is a fluorinated silicone such as F065 manufactured by Gelest, Inc., in Morrisville Pa., USA. This material is a single part gel. It can be applied as a fog or fine spray, or using the spin-on method. A suitable thickness is 2-5 microns after curing, with 2 microns preferred. A typical curing cycle is 125° C. for 25 minutes. This release material has a silane component that bonds well to glass surfaces, yet presents a fluid-like interface to polymeric materials like the base layer to be subsequently applied. FIG. 1C shows the result of lifting the resist to pattern the release layer, using a developer or resist stripper to swell the resist and effectuate the lift process; border 4 is clear of release material. A base layer 5 is then applied. Base layer 5 is preferably a polymer, and is applied in liquid form with a metering roll or using a spin-on or spraying method. A suitable polymer is Cyclotene, a polyimide manufactured by Dow Chemical. No adhesion promoters are used. After curing, a suitable thickness of base layer 5 is 40-80 microns, with 50 microns preferred. FIG. 1D is a cross-sectional view of section DD of FIG. 1C, and shows the relation between glass carrier 1, release layer 3, and base layer, 5. Surface region 6 is characterized by high adhesion between the base layer and the carrier, and surface region 7 is characterized by low adhesion between the base layer and the release layer. Base layer 5 may later be peeled off of surface region 7 without damage to the base layer or to circuits built thereon. An alternative method for providing the base layer is to laminate a preformed sheet of polymeric material onto the glass carrier, while providing for strong adhesion in surface region 6 to anchor the edges of the sheet, and weak adhesion in surface region 7 to facilitate later release.

Figure 2:
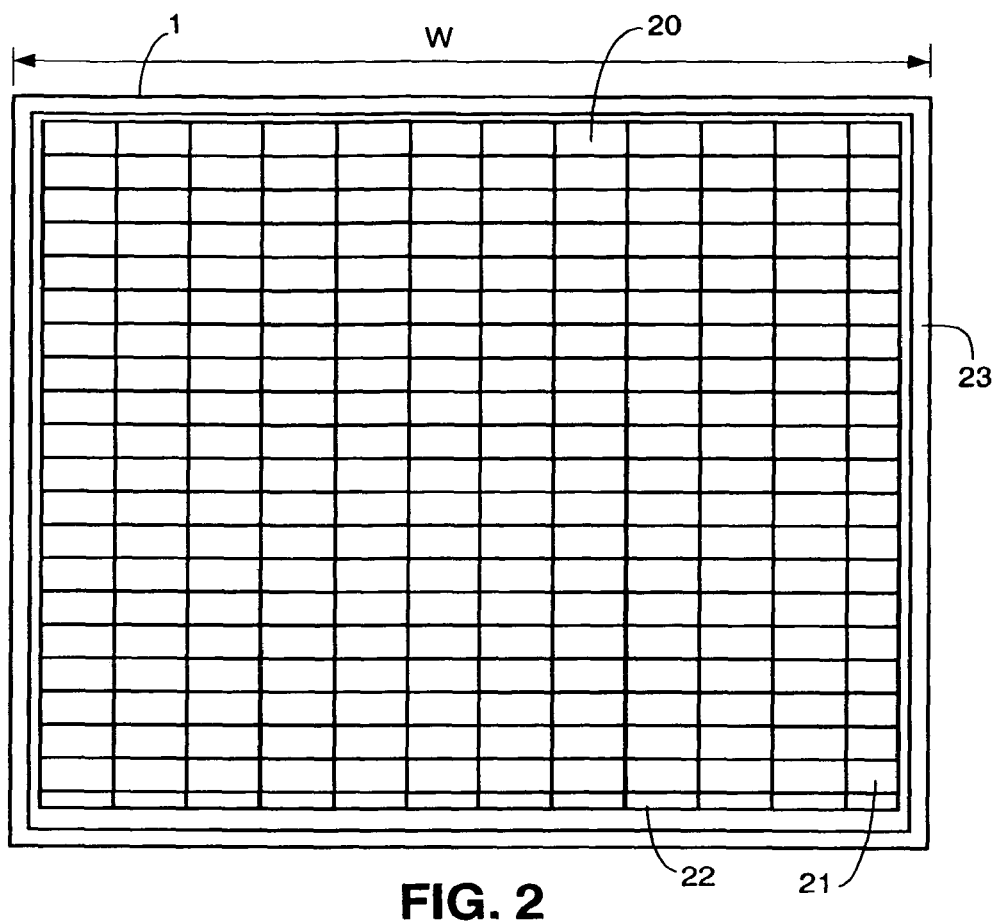
FIG. 2 is a plan view of multi-layer interconnection circuits arrayed on a glass carrier.

FIG. 2 shows a glass carrier 1 with a width, W, of 1250 mm, typical of $5^{th}$ generation LCD panels. A $7^{th}$ generation facility has been announced that will handle substrates 1800 mm×1500 mm. Although any size glass carrier can be used to carry out the present invention, larger sizes result in lower costs for the associated interconnection circuits, including bonding sites fabricated thereon in the form of wells filled with solder, to be further described. Materials other than glass can be used for the carrier, as long as they are rigid and dimensionally stable. Glass is preferred in the current invention because it is well characterized as a substrate material, and it is compatible with mature panel manufacturing methods such as for LCD fabrication. Individual multi-layer interconnection circuits 20 are arrayed across the glass carrier. In this example, interconnection circuits 20 measure 4 inches by 2 inches, and 220 copies are arrayed on the carrier. Multi-layer interconnection circuits 21 and 22 have different sizes representing other circuits to be manufactured. Border region 23 corresponds to surface region 6 of FIG. 1, and is a region of high adhesion between base layer 5 and glass carrier 1. When glass carrier 1 is diced into interconnection circuits 20, 21, and 22, it can be seen that the resulting circuits include only regions of low adhesion, for easily peeling away the individual glass carriers of interconnection circuits 20, 21, and 22. An alternative version of the layout represented in FIG. 2 includes streets of high adhesion provided between each of the interconnection circuits, included for improved dimensional stability of the interconnection circuits, and these streets are removed during the dicing operation.

Figure 3A:
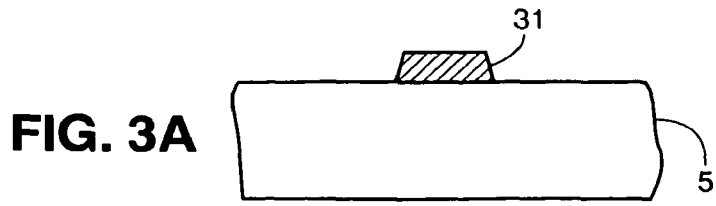
FIG. 3A-3E shows the process steps for creating the first few layers of an interconnection circuit.
Figure 3B:
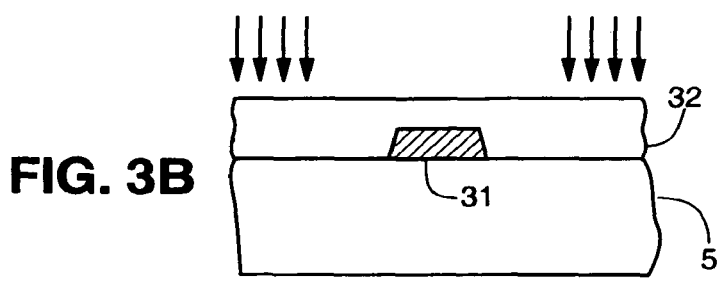
Figure 3C:
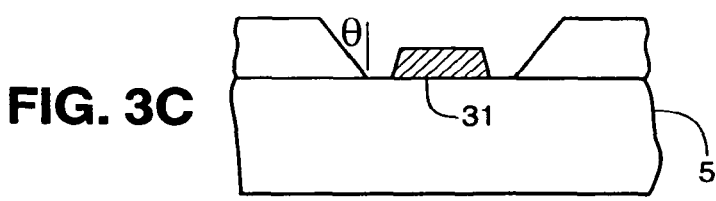
Figure 3D:
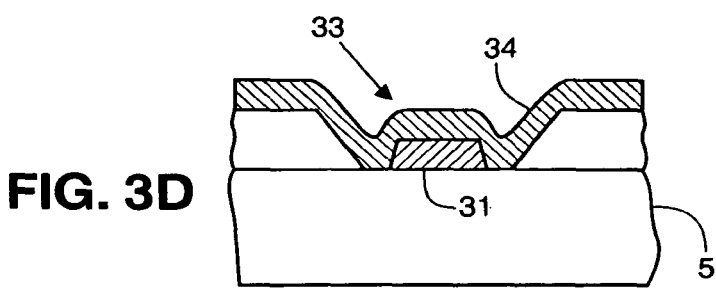
Figure 3E:
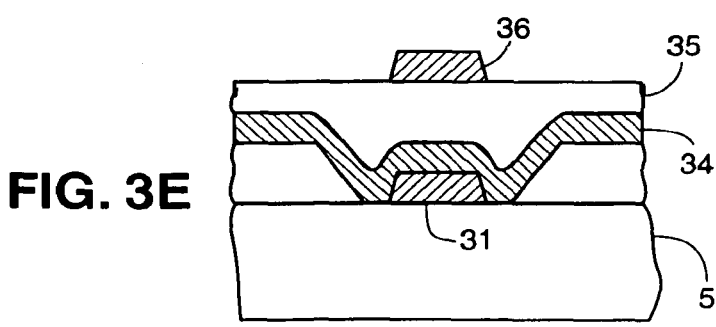

FIG. 3A-FIG. 3E represents the preferred method for forming thin film layers of multi-layer interconnection circuit 20 on base layer 5. The metal layers of multi-layer circuit 20 are preferably aluminum, deposited by sputtering in a vacuum chamber. A suitable thickness range is 1-2 microns, with 1 micron preferred. The metal layers are patterned using conventional photolithographic methods known in the art, and are preferably dry etched using plasma etching processes, also known in the art. The patterning of each layer typically includes coating with photo resist, exposing with light through a mask or reticle, developing the resist to form openings where the material is to be removed, and etching of the layer through the openings in the resist. Alternative metals may be used. In FIG. 3A a patterned trace of metal 31 is shown on base layer 5. For example, this trace has a width of 5 microns and a thickness of 1 micron. In between each layer of patterned metal is a layer of patterned dielectric, to provide isolation in the vertical direction between the metal traces. In FIG. 3B, the substrate and metal traces have been coated with a planarizing layer 32 of a photo-definable polymer as the inter-layer dielectric. A suitable photo-definable polymer is photo BCB, benzocyclobutene, a photosensitive form of Cyclotene. The term "photo-polymer" shall be used hereinafter for this material. The photo-polymer is applied in liquid form to planarize the surface. A suitable thickness of photo-polymer layer 32 is 2-4 microns after curing, with 2 microns preferred. In FIG. 3B a masked region of photo-polymer is exposed to light where the material is to remain. The effect of light on the photo-polymer is to form cross-linked molecules that become solidified (polymerized) and are not dissolved away in the subsequent development step. Polymer material that is not exposed to light is not cross-linked, remains in liquid form, and is removed by the development step. This is the same mechanism that occurs when patterning a negative photo-resist, and is referred to as negative image development. FIG. 3C shows the result of developing the polymer. The masked illumination of the exposure process causes photons to penetrate the surface of the polymer. The photons spread laterally as they penetrate to lower depths, causing cross-linking as they spread. The net result is a patterned polymer layer having tapered contact windows with an angle, θ, of approximately 45°, as shown in FIG. 3C. FIG. 3D shows the result of depositing and patterning the next layer of metal, 34, to form the two-layer contact, 33 between traces 31 and 34. Because the contact window is tapered rather than vertical, good metal coverage is achieved at the contact walls. FIG. 3E shows the addition of the next photo-polymer layer 35, and patterning of the next metal layer as metal trace 36. The foregoing description teaches the formation of multi-layer interconnection circuits, with alternating patterned metal and patterned polymer layers, by repeating the foregoing steps.

Figure 4:
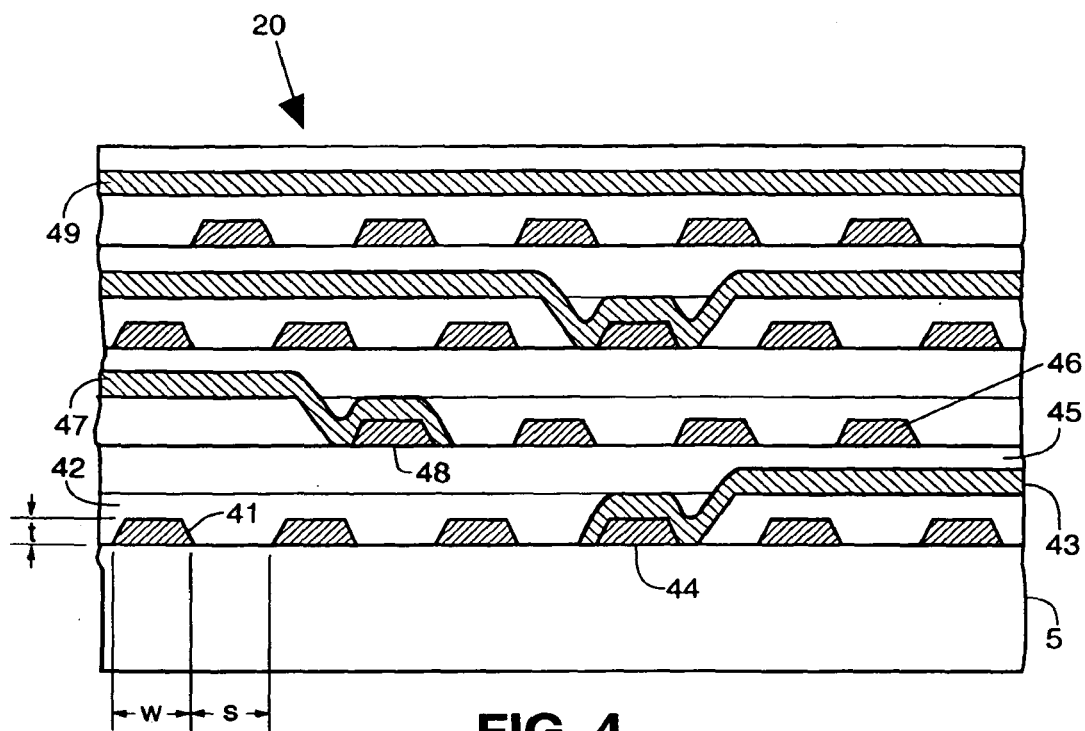
FIG. 4 is a cross-sectional view of a multi-layer interconnection circuit of the current invention.

FIG. 4 is a cross-sectional view of multi-layer interconnection circuit 20 of the present invention, introduced in FIG. 2. Base polymer layer 5 is shown. Conductive trace 41 of first layer metal is shown, with width, w, of 5 microns or less, spacing, s, of 5 microns or less, and thickness, t, of approximately one micron in the preferred embodiment. It may be desirable to arrange conductors on alternate layers to be generally orthogonal as in the figure, as is common practice for layout efficiency. A planarizing layer of photo-polymer, 42, has been applied over the first layer metal pattern using a roller to meter the thickness, or using spin-on or spray-on methods, with a preferred thickness of two microns after curing. A trace of second layer metal, 43, forms a two-level contact with a trace 44 of first layer metal. The next photo-polymer layer 45 again has a preferred thickness of 2 microns, and covers second layer metal 43 with a thickness of 1 micron. Photo-polymer layer 45 provides a planar surface for deposition and patterning of a third layer metal such as trace 46. Trace 47 is fourth layer metal and connects using a two-level contact to a trace 48 of third layer metal as shown. Additional layers are built up in the same manner, as required, and in principle any number of metal layers can be provided. In the figure, trace 49 is on the eighth metal layer.

Figure 5A:
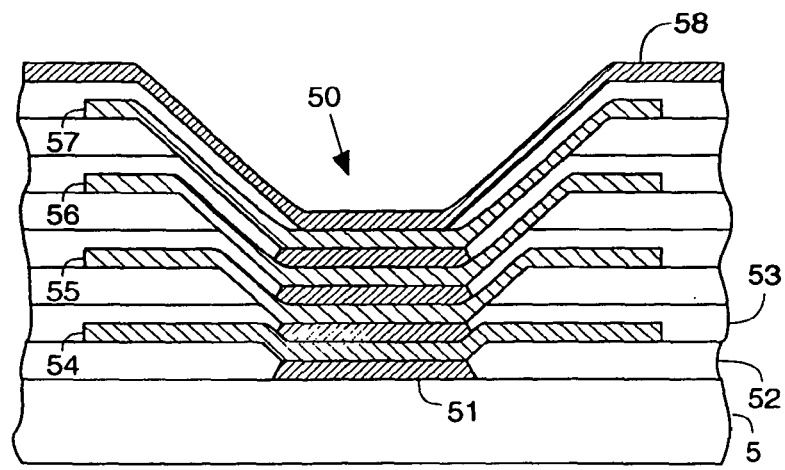
FIG. 5A is a cross-sectional view of a stacked contact.
Figure 5B:
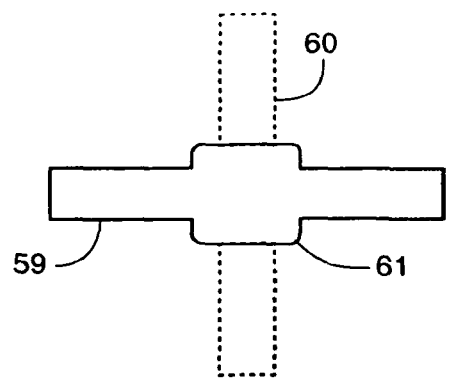
FIG. 5B is a plan view of a stacked contact, excluding I/O pad metal.

FIG. 5A shows an expanded cross-sectional view of a stacked contact 50 at an input/output (I/O) pad. Metal traces on alternate layers are preferably orthogonal as shown. A trace 51 of first layer metal is shown with a suitable trace width of 8-12 microns in this contact structure, with 10 microns preferred. Planarizing layers of photo-polymer such as 52 and 53 are used between each metal layer, as described in reference to FIG. 3 and FIG. 4. Trace 54 of second layer metal contacts trace 51 as shown. A contact stack of all metal layers is built up layer by layer, with stubs provided for connecting metal traces at any level. Stubs are short metal traces that are provided to establish points of access at each metal layer. Most of them will never connect to anything else. However, some of them will be extended into circuit traces of the interconnection circuit. Trace stubs 54, 55, 56, and 57, are on metal layers 2, 4, 6, and 8, respectively. Similarly, at 90 degrees rotation from these stubs, the odd numbered metal layers also have similar stubs (not shown). Finally I/O pad metal 58 connects with the contact stack as shown. It may be convenient to build a stacked contact like 50 at all of the I/O pads. The width of I/O pad metal is approximately 90 microns in the preferred embodiment, providing ample space for such a stacked contact. It is convenient for the circuit board layout designer to know that every node in the circuit is available at all metal layers (using the stubs), and at a known location. FIG. 5B shows a plan view of the stacked contact of FIG. 5A, excluding pad layer metal 58 to reveal the locations of the stubs. The location of stubs on even-numbered metal layers is shown 59, and odd-numbered metal layers 60. The common area 61 of the stacked contact is also shown.

Figure 6:
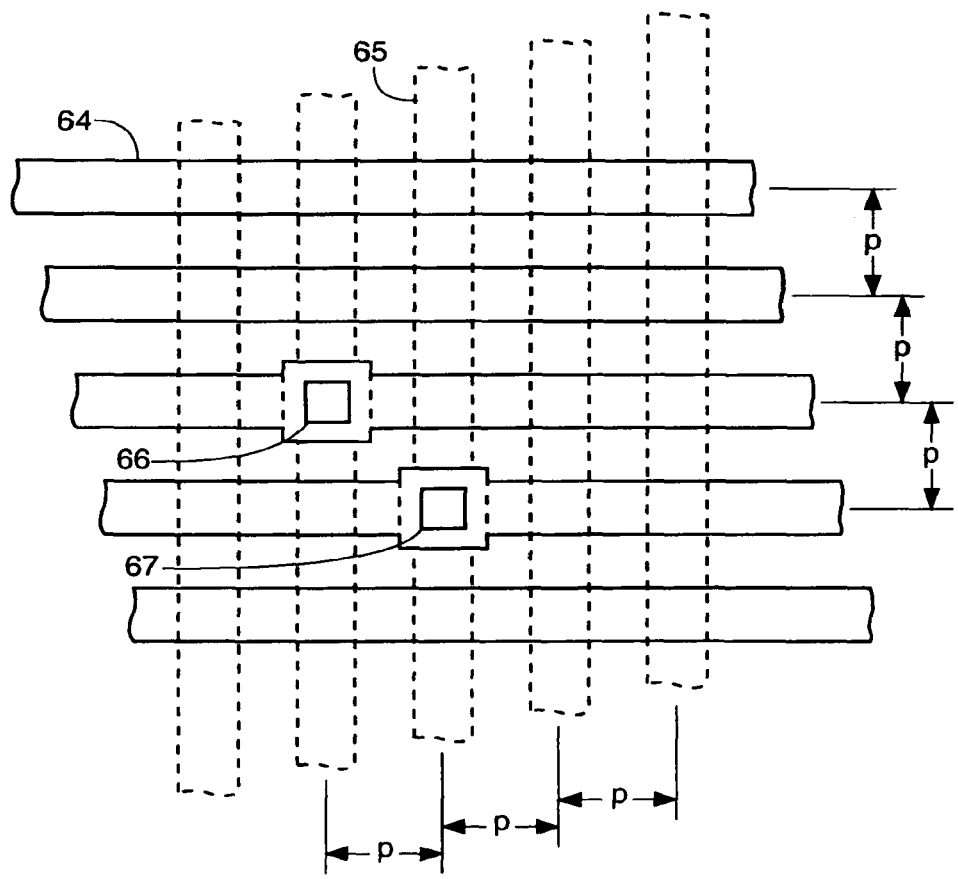
FIG. 6 is a plan view of metal traces with trace pitch, p.

Stacked contact 50 is necessarily larger in horizontal area than two-level contact 33, because of the long sloping contact walls of the stacked contact. The trace pitch for parallel runs of metal is a critical parameter for densely packed interconnection circuits. Parallel runs of metal generally require contacts to traces on other layers for effective trace routing of a multi-layer interconnection circuit. To achieve minimum trace pitch for such parallel runs, it is desirable to use contacts of minimum size. This can be accomplished if contacts that are formed at locations other than at the I/O pads are limited to two-level contacts. This is shown in FIG. 6. Horizontal traces such as 64 are on an even-numbered metal layer. Vertical traces such as 65 are on an adjacent odd-numbered metal layer. Contact windows 66 and 67 are for two-level contacts; they are closely spaced but staggered, and have a minimum contact area. The trace pitch p is consistent at 10 microns or less in both directions, and not increased for traces with contacts. This enables dense wiring patterns with predictable space requirements for trace routing programs.

Figure 7:
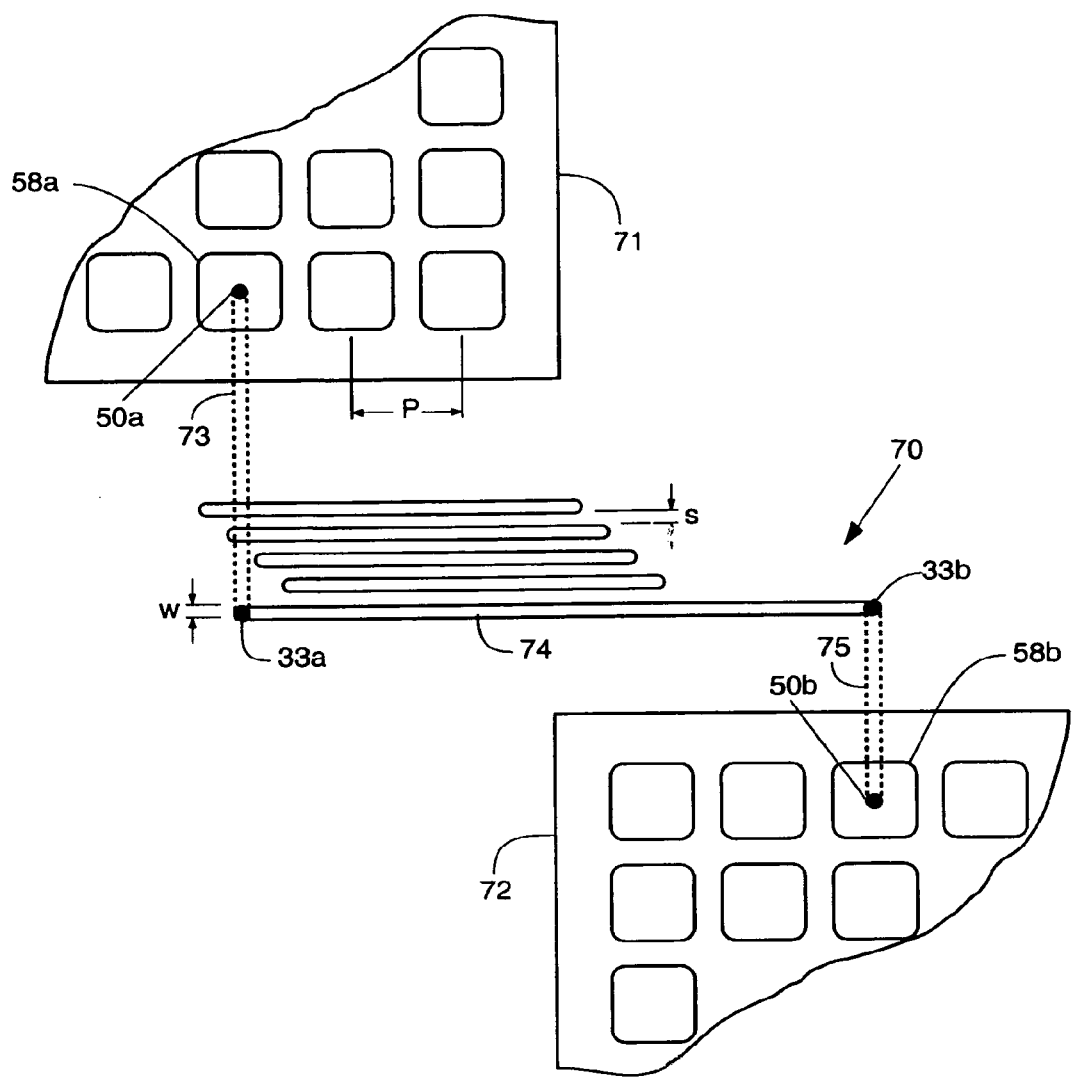
FIG. 7 is a schematic view of a circuit node connecting between I/O pads on separate IC chips.

FIG. 7 is a schematic plan view of a circuit node 70 that connects between an I/O pad 50a on IC chip 71, and I/O pad 50b on IC chip 72. A stacked contact 50a is shown at I/O pad 56a, as described in reference to FIG. 5. Trace 73 is on a metal layer below the surface layer, for example on metal layer 7 in a circuit with 8 metal layers. Trace 73 contacts using two-level contact 33a to trace 74 which is on metal layer 8 in this example. A set of parallel metal traces on layer 8 is shown, each trace having a width, w, of 5 microns or less in the preferred embodiment. The separation, s, between traces is also 5 microns or less in the preferred embodiment. The I/O pad pitch, P, is 100 microns or less in the preferred embodiment. Circuit node 70 continues from trace 74 to contact 33b, contacting to trace 75 on metal layer 7 in the example, and terminates at I/O pad 56b using stacked contact 50b.

Having explained the details of building a high density interconnect structure in the form of a flexible multi-layer interconnection circuit, we shall now focus on assembly and testing of IC chips on the interconnection circuit, to form a circuit assembly.

Figure 8A:
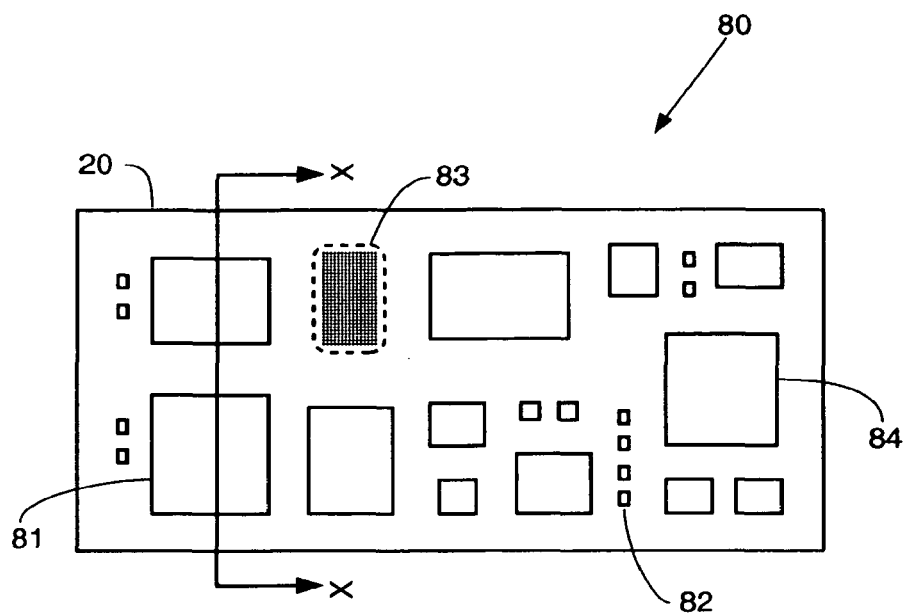
FIG. 8A is a plan view of a circuit assembly of the current invention.

FIG. 8A shows circuit assembly 80 with multiple IC chips such as 81, and other surface-mounted components such as 82 on multi-layer interconnection circuit 20. Components 81 and 82 are preferably attached by the flip chip assembly method. Alternatively, surface-mount components may be attached using known solder re-flow techniques. Module access port 83 provides an array of module access pads (I/O pads) for connection to external signals and power, as well as for connection to internal nodes of the interconnection circuit for testing purposes, as will be further described. IC chip 84 is a special-purpose test chip in the preferred embodiment, and is preferably the first IC chip to be assembled. For testing different circuit types, such as digital, analog, and radio frequency (RF), it may be desirable to assemble more than one special-purpose test chip. Alternatively, all forms of testing may be accomplished using external testers, accessed through module access port 83.

Figure 8B:
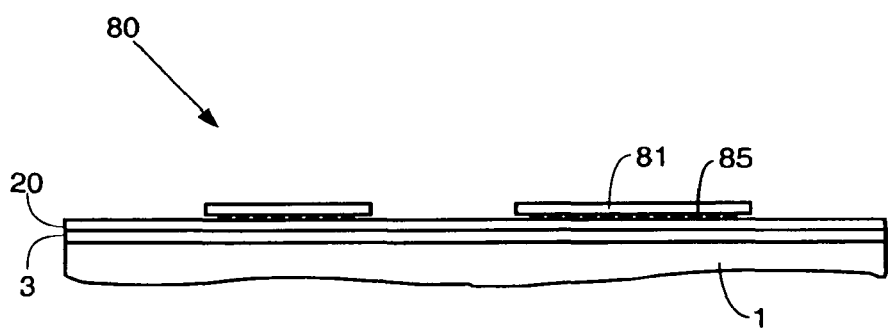
FIG. 8B is a cross-sectional view of section XX of FIG. 8A, and represents a circuit module in process.

FIG. 8B represents a cross-sectional view of section XX of FIG. 8A. Circuit assembly 80 is supported on release layer 3 on top of glass carrier 1. It includes interconnection circuit 20 plus attached components. IC chip 81 is attached using flip chip connections such as 85, which will be further described with reference to FIG. 9.

Figure 9A:
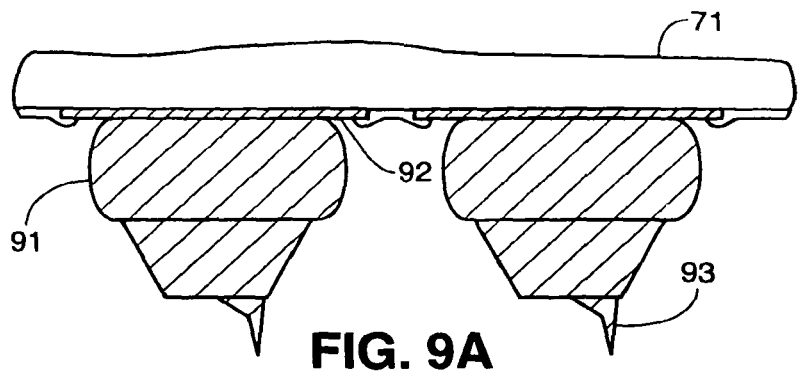
FIG. 9A-9C shows details of the preferred flip chip assembly method for an IC chip.
Figure 9B:
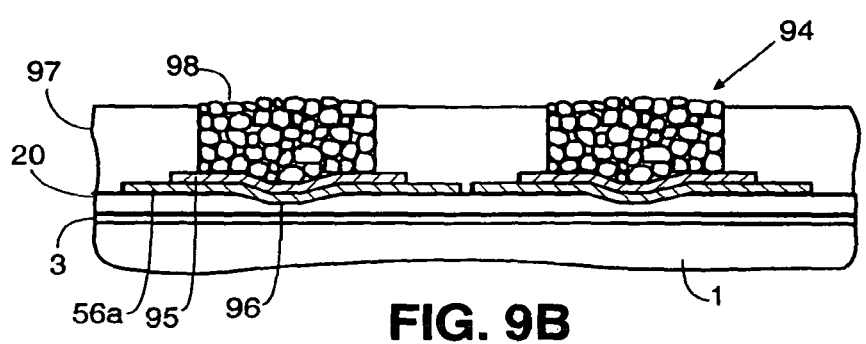
Figure 9C:
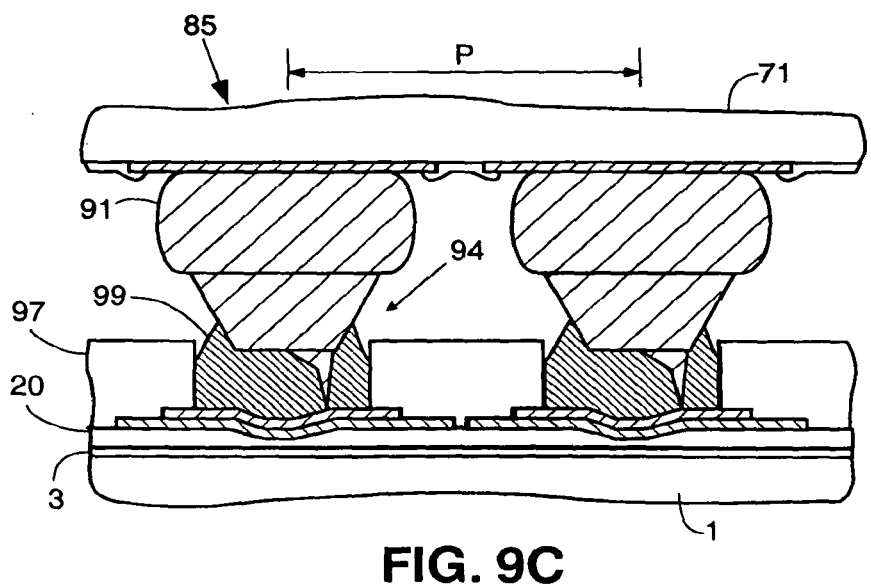

FIG. 9A-9C shows a sequence of steps for creating a flip chip bond of the current invention. FIG. 9A shows that an IC chip 71 has been prepared for assembly by forming gold stud bumps such as 91 at I/O bonding pads such as 92. Stud bumps such as 91 can be created using a Kulicke and Soffa 8098 bonder, using the application of heat, pressure, and ultrasonic energy. The process for forming the ball portion of the stud bump is the same as for a ball bonder. If an 18-micron diameter gold wire is used, the bonder can be configured to make stud bumps such as 91 with a ball diameter of 50 microns and an overall height of 50 microns. The "beard" 93 is created by accurately shearing the gold wire, and the tips of the beards can be coplanar within ±2.5 microns. FIG. 9B shows that multi-layer interconnection circuit 20 has been prepared for IC chip assembly by creating wells filled with solder such as 94 at each I/O bonding pad such as 56a. Bonding pad 56a has a preferred width of 80-100 microns, with a width of 90 microns in the preferred embodiment. It has been coated with a metallization 95, to prevent diffusion of solder materials into multi-layer circuit 20, to provide an oxidation barrier, and also to provide a solder-wetting surface. An acceptable sequence of layers for metallization 95 is an adhesion layer of aluminum, a solder diffusion layer of nickel, and an oxide prevention layer plus solder wettable layer of copper. This sequence is known in the art as under bump metallization, UBM. The bottom of well 94 is depressed at the center, 96, corresponding to the shape of a stacked contact provided at the I/O pad, as described in reference to FIG. 5. A planarizing layer 97 of polymer material such as non-photo-definable BCB is formed over the pads, at a thickness of approximately 15 microns when cured. Layer 97 is etched using known dry etching techniques to create openings at the wells. The openings have vertical walls, as shown in the figure. This is not generally possible using photo-polymers such as photo BCB, and this is why dry etching is used, with an anisotropic etching characteristic as is known in the art. Polymer layer 97 is cured to form the solder paste mask and is typically not removed, i.e., it remains a part of the finished circuit assembly. Solder paste 98 in well 94 is laterally confined by the opening in polymer layer 97. Paste 98 is applied using the wiping action of a squeegee over the mask surface. In the preferred embodiment, using a large glass panel as the carrier, several million wells are typically created with one pass of the squeegee. FIG. 9C shows a completed flip chip bond 85 of the current invention, with stud bump 91 inserted into well 94. Since the height variation of the stud bumps is held to ±2.5 microns, and since the beard is a ridge of small cross-section, and since gold is a soft and malleable material, a small amount of pressure applied to an IC chip will result in the tips of the beards making uniform contact with the bottoms of the wells. The solder paste has been melted and cooled to form a permanent bond. Solder 99 forms a strong mechanical bond with the beard and the underside of the stud bump, as well as a low resistance contact. The width of the well is approximately 34 microns in the preferred embodiment. The foregoing dimensions, together with the precise photo-lithographic patterning achievable with glass processing fabs, and the dimensional stability of the interconnection substrate (base polymer layer) with underlying glass, make a pad pitch P of less than 100 microns achievable. Examples of solder material that are suitable for the current invention include Sn/Pb/Sb in percentages 5/95/0, 63/37/0, or 95/0/5 respectively.

The amount of paste in a well is approximately $1.5 \times 10^{-7}$ gm in the preferred embodiment, at a material cost of approximately US$0.10 (10 cents) per gram. The labor and equipment costs of forming wells filled with solder are low for large glass carriers because several million wells are created in parallel. Included in the processing are a photolithographic step to form the solder paste mask, and wiping of a squeegee over the mask to deposit solder paste in the wells. The cost per stud bump using the Kulicke and Soffa 8098 bonder is approximately 0.03 cents, based on 200,000 bumps on an 8-inch wafer. Consequently, the cost of each flip chip connection in the current invention, including the stud bump and the corresponding well, is less than 0.05 cents or US$0.0005. This compares with current costs per connection of at least one cent for wire bonding and other flip chip bonding methods. Such a low cost for the current invention means that additional test points can be added to the module access port to make testing easier and more effective, perhaps decreasing the overall system cost due to testing economies.

Figure 10A:
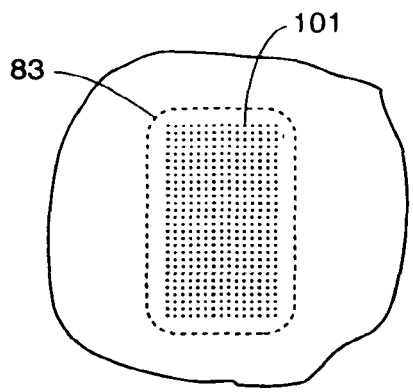
FIG. 10A is a plan view of a fragment of an interconnection circuit after additional processing to create the module access port.

FIG. 10A represents an example of a module access port 83 with individual module access pads such as 101 arrayed as shown. The module access pads provide a means for electrical connection from interconnection circuit 20 or from circuit assembly 80 to other electronic assemblies or devices, and include provision for data signals, control signals, and power. A circuit assembly such as 80 will typically require several different working voltages for operation. Preferably, power at the highest working voltage will be delivered through module access port 83, and local converters and regulators implemented on one or more IC chips will provide other working voltages that are required. The converters and regulators may be programmable in order to adjust the working voltages for testing purposes. An external tester can be used to validate the integrity of the interconnection circuits prior to assembling IC chips and other components. It may be advantageous to provide a module access pad for every node on the interconnection circuit, to provide 100% test coverage for short circuits. If a module cable of the current invention is used, as further described with reference to FIG. 14 through FIG. 18, module access pads 101 can have a pitch of less than 100 microns, just like flip chip bonding sites 85. If an interconnection circuit has 4000 nodes, corresponding to a complex system board, then the corresponding area occupied within the module access port to provide 4000 connections is only 0.4 cm² at a bonding pitch of 100 microns. Some open circuit testing may also be performed on critical nets (distributed nodes). This is similar in concept to a "bed-of-nails" test that is typically performed on conventional printed circuit boards. In some cases, repair of defective interconnection circuits may be appropriate, preferably using focused ion beams, FIB.

The layout of circuit assembly 80 is so dense, both in the fine line traces, and in the fine pitch assembly, that conventional connectors and cables are not well suited for interconnecting modules of this type; they would occupy a large fraction of the total module space. Consequently, part of the current invention is to provide an effective means for connecting circuit assemblies to testers, and circuit modules to other circuit modules or to other electronic systems employing different manufacturing methods. The same methods that are used to fabricate circuit assembly 80 can also be used to fabricate a test fixture and a module cable.

Figure 10B:
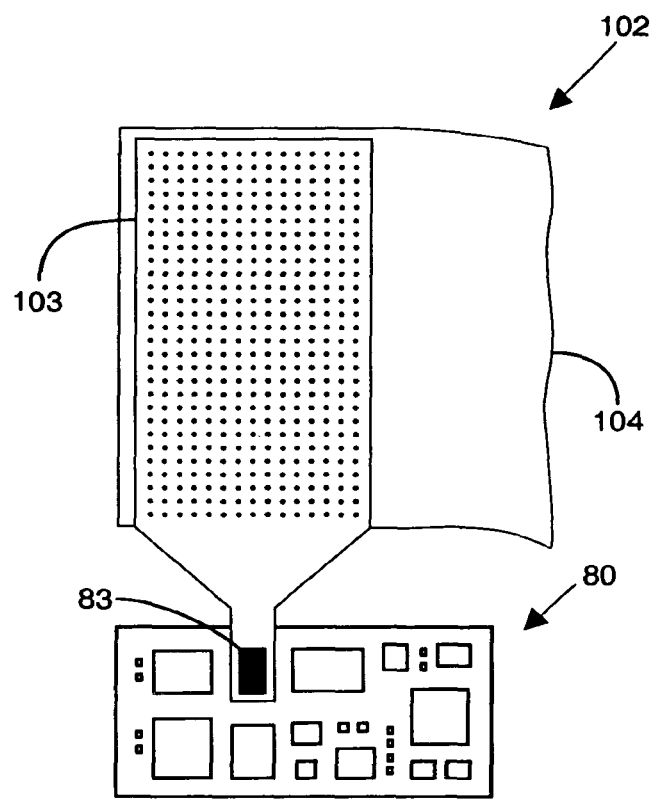
FIG. 10B shows a test fixture of the current invention, in relation to a circuit assembly.

In FIG. 10B, a test fixture 102 is shown connecting to module access port 83 of circuit assembly 80. A redistribution of the module access pads is provided on glass substrate 103, so as to connect conveniently via cable 104 to an external tester. For small arrays of module access pads, a single layer of aluminum is patterned on glass substrate 103, with a one-to-one connection between module access pads in the module access port, and corresponding pads in the redistributed array. This can be accomplished if redistributed array 103 is a scaled mirror image of the module access pad array. For larger arrays, a multi-level interconnection circuit is required. As previously described in reference to FIG. 9 for creating stud bumps on IC chips, so stud bumps are bonded on test fixture 102. They are provided with a pad pitch of 100 microns at the small end containing the module access port, to mate with wells filled with solder at each of the module access pads. Connection to pads in the redistributed array of test fixture 102 may be accomplished with a conventional flexible circuit, for example. Such a flex circuit may have copper conductors, and may include gold plated bumps that connect by contact with the pads of the redistributed array. The pads of redistributed array 103 may be enlarged, and coated with gold for a low-resistance contact. A primary purpose of test fixture 102 is to provide connection means for verifying the integrity of the multi-layer interconnection circuits before any components are assembled. Secondary purposes may include testing of the circuit assembly as each component is attached, if test chips are not provided on the circuit assembly. If test chips are provided, then test fixture 102 may be used to connect these chips to an external tester for verification, prior to assembly of the other components. Connections to the module access port can be unmade by heating the solder and withdrawing the stud bumps. Heat can be applied using a hotplate under the glass carrier, typically bringing it to a temperature below the solder melting point, as well as applying heated inert gas to the top side of glass substrate 103. After inspection, touch up of the wells may be required. Then another connection to the module access port can be made for a different purpose.

Figure 11:
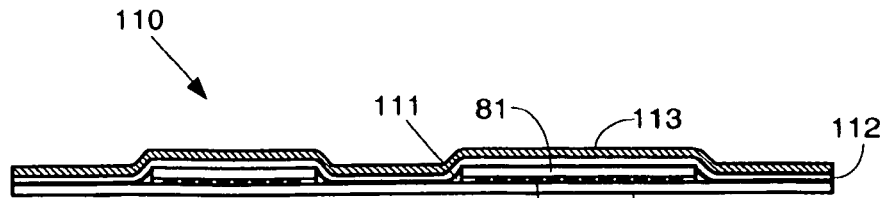
FIG. 11 is a cross-sectional view of a circuit assembly showing the first module level coatings.

Before permanently assembling a module cable to the circuit assembly, it is desirable to coat the top surface with a dielectric layer and a metal layer. The dielectric layer prevents shorting of components when the metal layer is subsequently applied. The metal layer provides a shield at the top surface, except for small holes at the module access pads, as will be further described in reference to FIG. 12. FIG. 11 shows a cross-sectional view of circuit assembly 110, which is the same as circuit assembly 80 of FIG. 8 except that module level coatings have now been applied. At the edges of components, where vertical faces meet interconnection circuit 20, fillets 111 are shown. They provide support for dielectric coating 112 which is a passivating layer of Parylene in the preferred embodiment. The material of fillet 111 is silicone rubber or other inert material. It is applied by extruding a bead of the material, then following with a narrow spatula to shape the bead into a triangular cross-section. The fillet material is then cured, and dielectric film 112 and metal film 113 applied. Metal film 113 is the first topside module-level metal film. It provides a metal coating in the region of the module access port, except for small openings at the module access pads. This area will not be covered by second module-level topside metal, because when that coating is deposited a module cable will be connected at the module access port. Metal film 113 is preferably aluminum with a thickness of one micron. Other metals and thicknesses can be used. One micron of aluminum provides good hermetic protection, as well as good electromagnetic shielding, at reasonable cost.

Figure 12A:
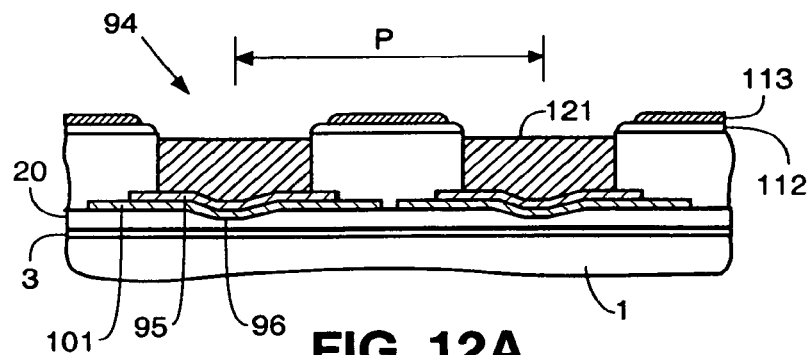
FIG. 12A-12B shows details of the preferred method for connecting a module cable or a test fixture to a circuit module.
Figure 12B:
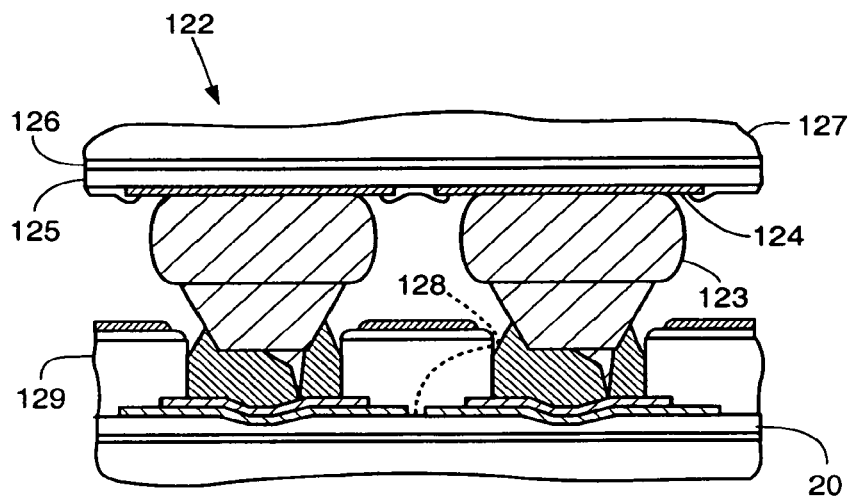

FIG. 12A-FIG. 12B show the similarity between flip chip connections 85 for connecting IC chips, already described in reference to FIG. 9, and module access port connections such as 122, shown in FIG. 12B. FIG. 12A shows multi-layer interconnection circuit 20 on release layer 3 on glass carrier 1.

An I/O bonding pad 101 is shown, which in this case is a module access pad of module access port 83. Bonding pad 101 connects to a circuit node of interconnection circuit 20 using a stacked contact as previously described. Metallization 95 is shown over the bonding pad, as previously described. The pitch between wells filled with solder such as 94 is P, which is 100 microns or less in the preferred embodiment. Module-level packaging layers 112 and 113 are also shown. Layer 112 is a passivating layer of Parylene, and layer 113 is a hermetic and shielding layer of metal as previously described. Well 94 has been filled with solder paste as previously described, and the paste has been melted into solder form, 121. FIG. 12B shows an enlarged portion of a module cable inverted over the wells. Gold stud bumps 123 are bonded to metal pads 124 which sit on interconnection circuit 125 on top of release layer 126, on top of glass carrier 127 (inverted in the figure). Referring to the shape and size of multi-layer circuit 22 in FIG. 2, and understanding that a common manufacturing process may be used to fabricate circuit assemblies and module cables, it can be seen that 125, 126, and 127, may actually be the same as 22, 3, and 1, respectively. The path 128 for water to migrate into interconnection circuit 20 is shown. The surfaces surrounding the wells are coated with a dielectric, 112, and a metal layer, 113, to provide a barrier to water at the module access pads, in the area surrounding but not including the wells. The solder in the wells also provides an effective water barrier, leaving just a narrow entry point for water, and a long path 128 through the polymer shown as layer 129 in FIG. 12B. Polymer layer 129 also provides a barrier to water, especially at the preferred thickness of 15 microns. Thus the module access pads are semi-hermetic. Since the area of the module access port is small compared with the total surface area of the module, the total exposure to water is limited to a semi-hermetic portion of small extent.

Referring back to FIG. 8A, the assembly and test sequence of the electrical components such as IC chip 81 will now be discussed. Before assembling any components, a test fixture such as 102 is temporarily attached to the module access port, with the other end connected to a tester. The multi-layer interconnection circuit is tested for opens and shorts, and rejected if defective. The first chip to be assembled is preferably test chip 84. This chip is also tested by an external tester with capabilities suitable for testing both the functional and parametric specifications of the test chip. If defective, the test chip is replaced. It is heated by application of hot inert gas, the solder in the wells is melted, and the stud bumps lifted out of the wells. The wells are inspected, and touched up if necessary. Touch up may include adding more solder paste, and removing any solder on the surface between the wells. The same procedure is used for rework of any defective IC chips. Once installed and tested, the test chip is capable of testing the remaining components at circuit speed, after each one is attached. Alternatively, each new component may be tested using an external tester, connected using test fixture 102. The testing of each added component is performed in the system environment of components that have already been assembled. If a component is defective, it is replaced before assembling the next component. If desired, testing can be performed at an elevated temperature applied to the entire circuit assembly, using a heater under the glass carrier. After the circuit assembly has been completely assembled and tested, the test assembly is removed so as not to obstruct the coating of an additional top surface metal layer, as further described in reference to FIG. 17A. The overall sequence for creating a tested circuit assembly is presented in the form of a flow graph in FIG. 19.

Figure 13:
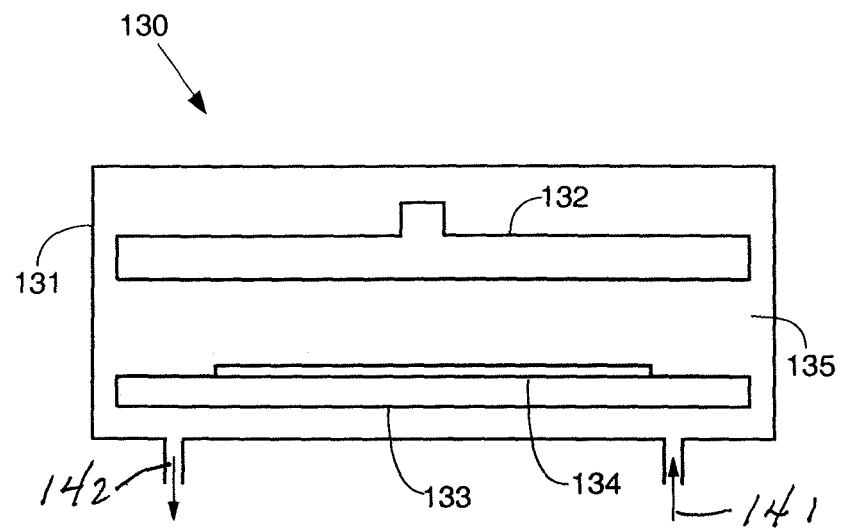
FIG. 13 is a schematic view of an RF sputtering machine.

FIG. 13 shows a conventional RF sputtering chamber 130, used for vacuum deposition of metal layers. Vacuum chamber 131 has an inlet port 141 for a sputtering gas such as argon, and an exit port 142 connected to a vacuum pump as shown. Chamber 131 includes a top electrode 132 that is connected to an RF source (not shown), and a counter electrode 133. The part to be coated 134 normally sits directly on counter-electrode 133. During sputtering, a plasma 135 of ionized gas is formed between the top electrode and the counter-electrode as shown. These details are provided as background for a modification to this apparatus, further described in reference to 15 FIG. 17A and 17B, wherein a pedestal is used to raise the part to be coated above the counter-electrode.

Figure 14:
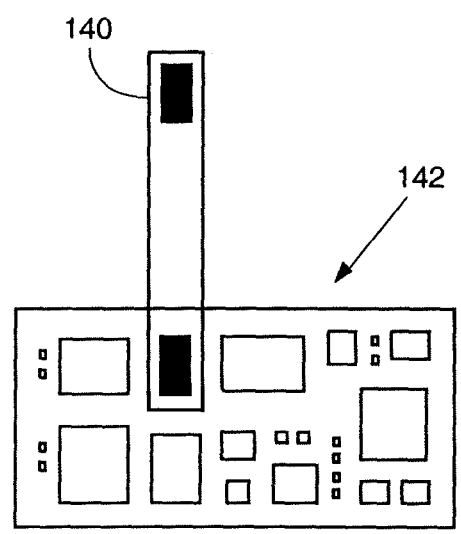
FIG. 14 is a plan view of a module cable of the current invention, connected to a circuit assembly.

FIG. 14 shows a module cable 140 of the present invention, in plan view. It is connected to a circuit module such as 142, before the glass carrier of 142 is removed to apply the bottom side metal.

Figure 15:
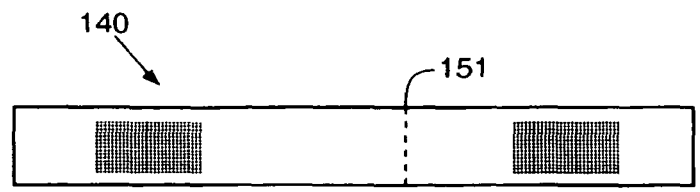
FIG. 15 shows a scribe mark on the glass carrier of a module cable.
Figure 16A:
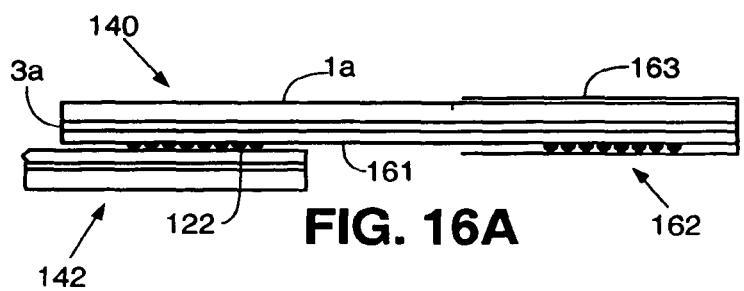
FIG. 16A-16C shows the process steps for connecting a module cable to a circuit assembly.
Figure 16B:
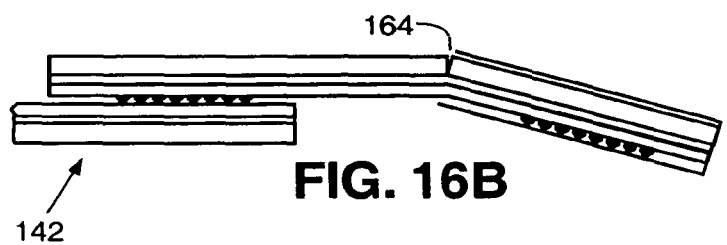
Figure 16C:
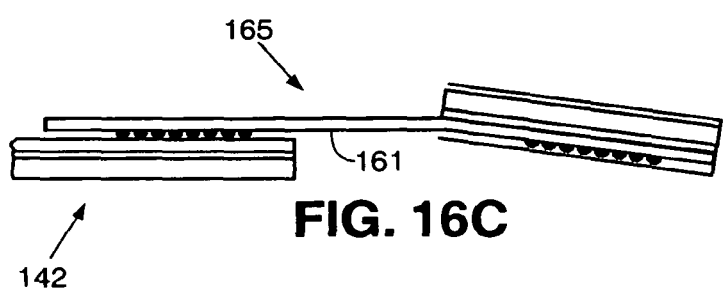

FIG. 15 shows module cable 140 with an array of module access pads at each end of the bottom surface (made visible in the figure for descriptive purposes). On the top surface, a scribe line 151 has been scored in the glass surface with a scribing tool, marking the place where the glass carrier will later be cracked into two separate pieces. Alternatively, scribe line 151 may be a shallow cut with a diamond saw, positively defining the location of the break to be made, while leaving enough glass thickness to provide adequate strength for handling. FIG. 16A through FIG. 16C show the sequence for connecting one end of module cable 140 to a circuit assembly such as 142. To maintain the necessary dimensional stability, it is critical that a glass carrier be present on both sides of the connection interface while the bond sites on both sides are aligned and the bonds are permanently created. In FIG. 16A, module cable 140 is comprised of a glass carrier 1a with a release layer 3a (as previously described) and a single or multi-layer interconnection circuit 161 with stud bumps such as 122 attached at each bonding pad of an array of module access pads. A similar array 162 is shown at the other end of module cable 140. Interconnection circuit 161 includes a single or multi-layer interconnection circuit that connects pads between the two arrays in a one-to-one relationship. A cover 163 protects the unused end of module cable 140, including the second array of gold stud bumps 162, until the module is connected to another circuit module, or to another electronic system. Module cable 140 can be envisaged in a more complex form, including three or more arrays of module access pads, with each array connecting to a circuit module, or to an electronic system other than a circuit module. One or more of the arrays of module access pads may be redistributed with a larger pad pitch for greater ease of connection to a particular piece of electronic equipment, as was described for test assembly 102. FIG. 16A shows module cable 140 positioned above circuit assembly 142. When correct alignment has been achieved, heat is applied to form permanent bonds between stud bumps on module cable 140, and corresponding wells filled with solder on circuit assembly 142. This connection is as described in FIG. 12A-12B. FIG. 16B shows that a bending force has been applied, to crack the glass carrier into two pieces at scribe line 151. Crack 164 is shown. In FIG. 16C, one portion of glass carrier 1a has been removed by peeling the glass piece away from interconnection circuit 161, leaving behind interconnection circuit 161 attached to circuit assembly 142 at each of the module access pads. A module cable that is connected at one end is labeled 165.

Figure 17A:
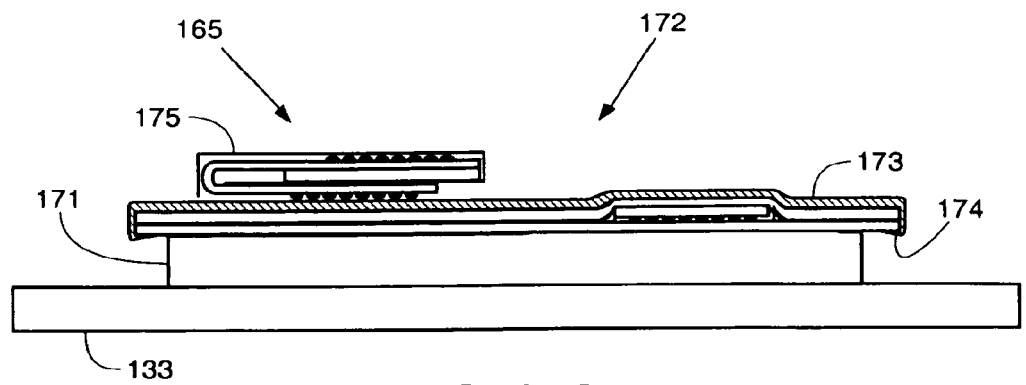
FIG. 17A shows the method for coating the second topside module-level metal layer.
Figure 17B:
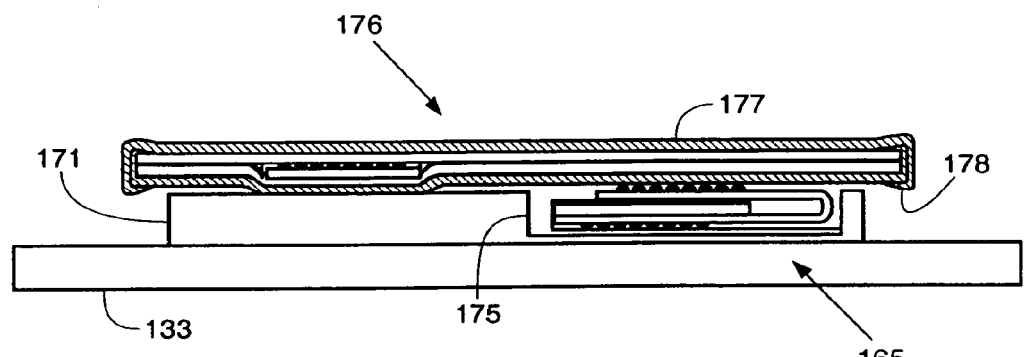
FIG. 17B shows the method for coating the bottom side module-level metal layer.

It is desired to create a continuous metal envelope around the circuit assembly including the interconnection circuit and the attached components, with only a small opening at each of the module access pads. It is critical that the top and bottom metal layers form an overlapping seam of continuous metal at the edge of the circuit assembly. A preferred method for achieving this is shown in FIG. 17A-17B. FIG. 17A shows counter-electrode 133 previously described in reference to FIG. 13. For convenience, only the counter-electrode of RF sputtering chamber 130 will be shown in FIG. 17A-17B. Normally, the part to be coated in a sputtering chamber requires deposition on the top surface only, and is placed directly on the counter electrode. In the current invention, a pedestal 171 is provided on the counter electrode to lift the edges of circuit assembly 172 above the counter electrode, providing a gap between them of a few millimeters. The effect of this arrangement is that a top layer metal film 173 will also coat around the edge of the circuit assembly with a thickness that tapers to zero, 174, underneath circuit assembly 172. The preferred metal film 173 is aluminum, with a thickness of one micron, that adds to the first module-level metal film 113, also with a thickness of one micron. After top layer metal 173 has been deposited, the circuit assembly is flipped on pedestal 171 as shown in FIG. 17B. A cutout 175 is provided in pedestal 171 to store module cable 165, in a manner that leaves the edges of circuit module 172 exposed for coating. After deposition of bottom side metal 177, circuit module 172 becomes circuit module 176. Again, the coating extends around the edges, 178. The net result is a continuous metal film covering the top side, the bottom side, and the edges, to form a complete envelope around the circuit assembly. An alternative method for creating a metal layer with a coating that extends around the edge like 178, is to use a vacuum evaporator. In this case the circuit assembly is held on a carousel, and the carousel executes a planetary motion as is known in the art to effect coating of a substrate from many different angles.

Figure 18:
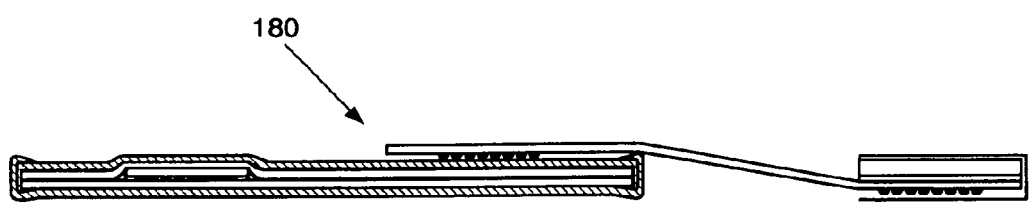
FIG. 18 is a cross-sectional view of a system module with attached module cable of the current invention.

FIG. 18 shows a completed system module 180 whose interconnection circuit and attached components have been thoroughly tested as an integrated system. System module 180 includes a continuous metal envelope except for small openings at the module access pads, and a module cable that has been attached with fine pitch connections. The metal envelope provides a hermetic seal. It also provides an effective electrical screen for reducing electromagnetic interference, EMI, and particularly electromagnetic radiation, EMR, produced by the circuit module. The metal envelope also reduces electromagnetic susceptibility, EMS, by reducing the effect of external electronic noise on the circuits within the module.

Figure 19:
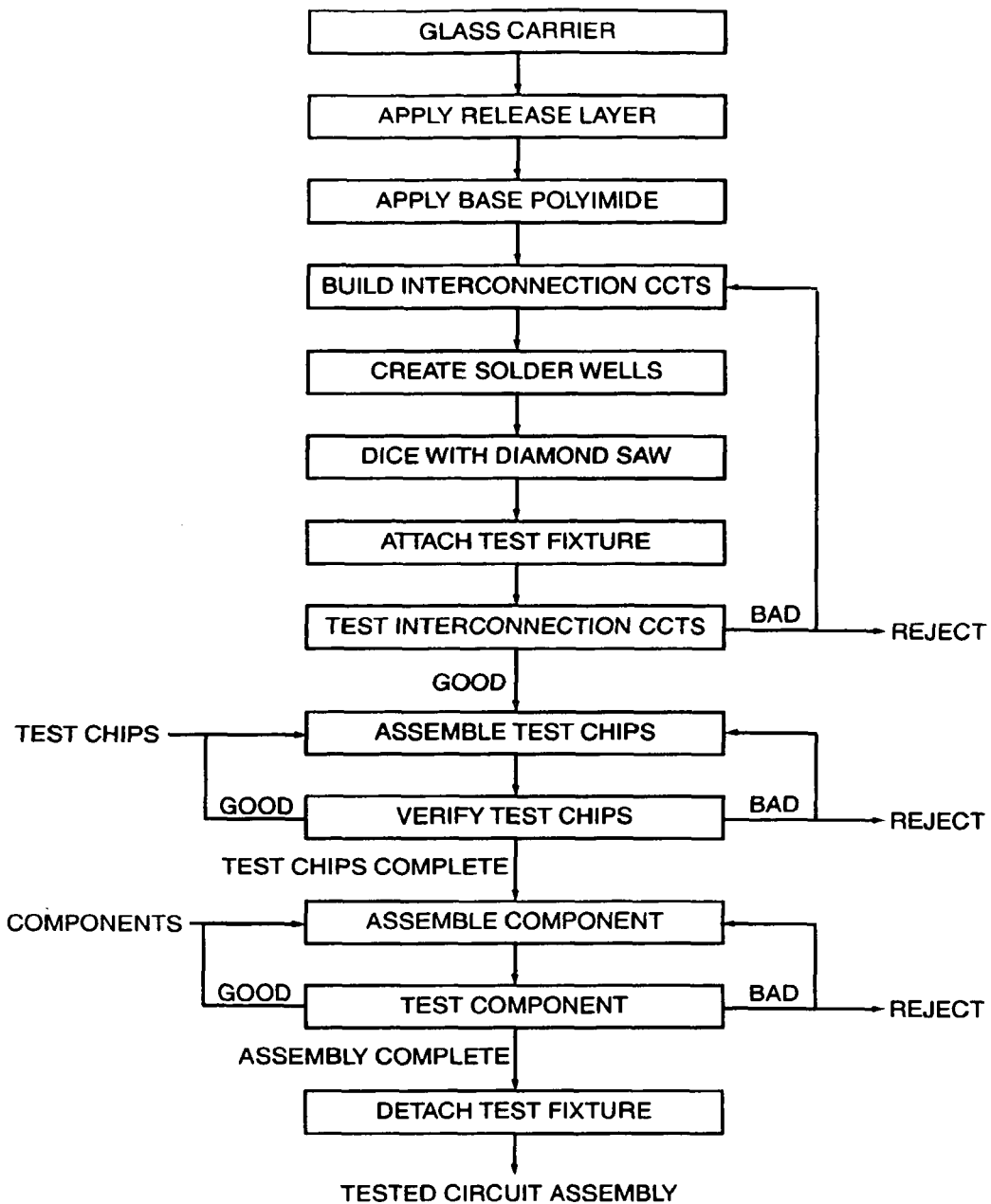
FIG. 19 is a flow chart summary of the process steps to create a tested circuit assembly.

FIG. 19 shows a summary in the form of a flow chart of the aforementioned process for constructing a circuit assembly of the present invention.

Figure 20:
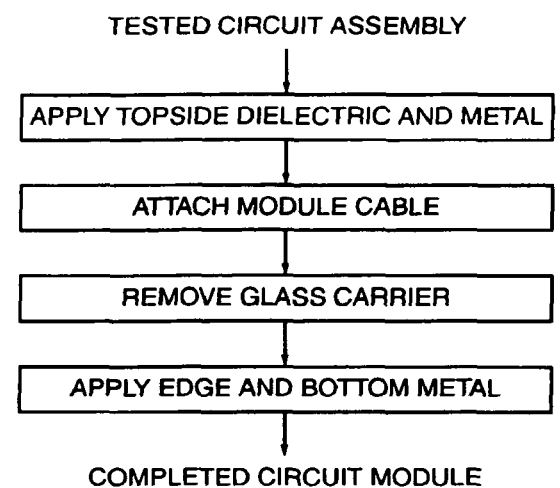
FIG. 20 is a flow chart summary of the additional steps to convert a tested circuit assembly into a completed circuit module.

FIG. 20 shows a summary in the form of a flow chart of the aforementioned process for constructing a system module from a circuit assembly.

Figure 21:
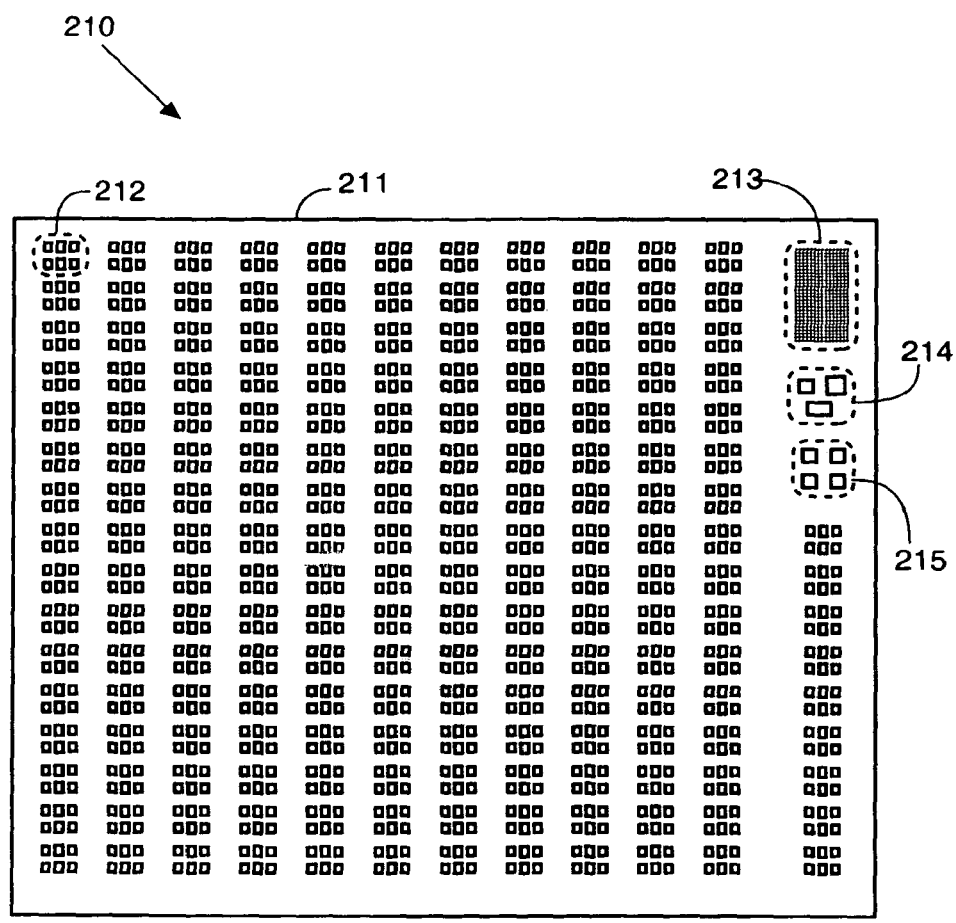
FIG. 21 is a plan view of a blade server component of the current invention.

FIG. 21 shows an alternative embodiment of a circuit assembly, such as for a blade server component, 210, of the current invention. A single large interconnection circuit 211 contrasts with the array of smaller interconnection circuits 20 shown in FIG. 2. Processing groups of IC chips 212 are arrayed as shown. Each processing group may include processor chips, memory chips, and bus-interface chips, for example. The dense interconnection circuits and assembly methods of the current invention provide for a large computational capability on circuit assembly 210. A module access port 213 is shown, for connecting to other systems, including test systems. A group of special-purpose programmable test chips is provided, 214, and also a maintenance group of IC chips 215, for maintenance of the blade server. For example, any failure occurring in a processing group may be automatically detected by a background process running on maintenance group 215, which will reconfigure blade server component 210 to bypass the defective group for any further operations. The same methods as previously described for incremental assembly and test may be applied to blade server component 210.

Figure 22:
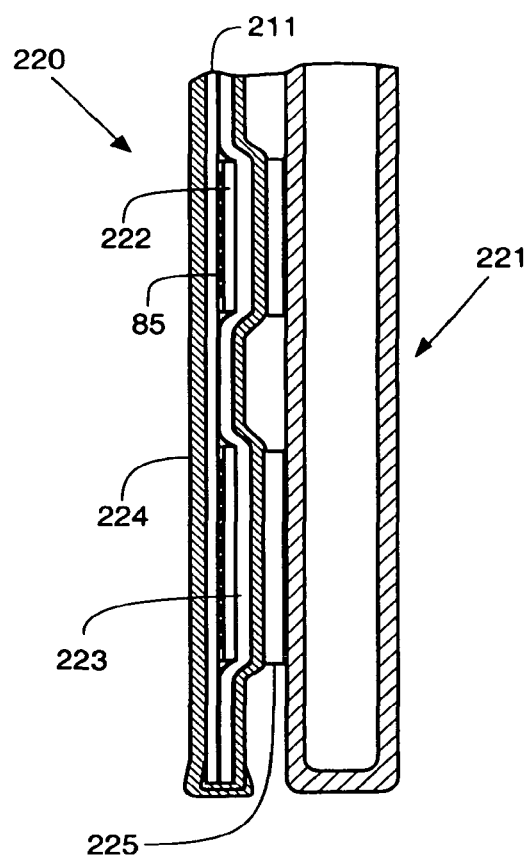
FIG. 22 is a cross-sectional view of a circuit module attached to a heat sink.

In FIG. 22, circuit assembly 210 has been converted into circuit module 220 by application of module-level coatings, as previously described. FIG. 22 shows a fragment of circuit module 220 coupled with a heat sink 221. Circuit module 220 includes multi-layer interconnection circuit 211 (manufactured as previously described for interconnection circuit 20) with IC chips such as 222 attached by flip chip bonds 85, as previously described. Similarly, module-level coatings including dielectric layer 223 and metal envelope 224 are fabricated using the same methods as previously described for circuit module 176. Circuit module 220 is attached to heat sink 221 at the faces of chips such as 222, using pads of conductive epoxy 225 that are screened onto completed module 220 at each attached IC chip. Heat sink 221 preferably contains a re-circulating coolant fluid, to extract heat effectively using a heat sink of small volume. Circuit module 220 and heat sink 221 combine to form a blade server component that can be inserted into a large computer facility, with appropriate provisions for electrical and plumbing connections. The thermal path from active transistor junctions on IC chips such as 222 to heat sink 221 has low thermal impedance. It includes only one layer of non-conducting material, which is preferably a thin layer of Parylene 223 in the current invention. This means that IC chips of blade server module 220 can operate at high power levels, without exceeding their maximum junction temperature specifications.

What is claimed is:

1. A stacked contact formed between a plurality of metal traces of a multi-layered interconnection circuit, comprising:
a base polymer layer;
a plurality of first metal traces extending in a first direction;
a plurality of second metal traces extending in a second direction transverse to the first direction, wherein the first and second metal traces are alternately formed on separate layers of the interconnection circuit;
a plurality of intervening layers of patterned polymer with each of the first and second metal traces being disposed between two of the intervening polymer layers; and
a contact window with tapered walls in each of the intervening polymer layers, wherein
the contact windows are vertically aligned and each of the contact windows is positioned to expose an underlying one of the first or second metal traces,
each of the first and second metal traces excluding the lower most of the first and second metal traces is formed over and in direct contact with an underlying one of the first and second metal traces so as to form a stacked contact aligned with the contact windows and providing an input/output pad, the lower most of the first and second metal traces being formed over the base polymer layer,
a tapered portion of each of the second metal traces in a contact window is separated from adjacent second metal traces by an intervening patterned polymer layer, and
the multi-layered interconnection circuit includes a plurality of interlayer contacts between the first and second metal traces other than the stacked contact.

2. The stacked contact of claim 1 wherein said patterned polymer is photo-defined.

3. The stacked contact of claim 1 wherein said patterned polymer is photo-imageable Cyclotene.

4. The stacked contact of claim 1 wherein at least one of the first and second metal traces provides a trace stub.

5. The stacked contact of claim 1 wherein:
the interlayer contacts other than the stacked contact includes direct contact between an overlying trace of the first and second metal traces and an underlying trace of the first and second metal traces;
the underlying trace has top and bottom surfaces and two side surfaces extending there between; and
the overlying trace directly contacts the underlying trace on the top and the two side surfaces of the underlying trace.

6. The stacked contact of claim 1 wherein the second direction is orthogonal to the first direction.

7. The stacked contact of claim 1 wherein the walls of each contact window are continuously tapered.

8. The stacked contact of claim 1, wherein the lower most of the first metal traces directly contacts the base polymer layer.

9. The stacked contact of claim 1, further comprising an input/output pad metal layer formed over and electrically connected to the stack of the first and second metal traces.

10. The stacked contact of claim 1, wherein two or more of the plurality of first metal traces that extend in a first direction do not extend in the second direction up the tapered walls of a corresponding contact window.

11. A multi-layer interconnection circuit wherein a stacked contact providing connection between all of a plurality of first conducting traces disposed on separate layers and a plurality of second conducting traces disposed on separate layers is included at each input/output pad of each integrated circuit chip to be assembled on said multi-layer interconnection circuit, wherein the stacked contact is formed over a base polymer layer, wherein the first conducting traces extend in a first direction and the second conducting traces extend in a second direction transverse to the first direction, wherein the first and second conducting traces are alternately formed on separate layers, and wherein the multi-layer interconnection circuit includes a plurality of interlayer contacts between the first and second conducting traces other than the stacked contact.

12. The multi-layer interconnection circuit of claim 11 wherein contacts of said multi-layer interconnection circuit, other than said stacked contacts, are limited to two-level contacts where a desired minimum trace pitch is to be maintained.

13. The multi-layer interconnection circuit of claim 11 wherein:
the interlayer contacts other than the stacked contact includes direct contact between an overlying trace of the first and second conducting traces and an underlying trace of the first and second conducting traces;
the underlying trace has top and bottom surfaces and two side surfaces extending there between; and
the overlying trace directly contacts the underlying trace on the top and the two side surfaces of the underlying trace.

14. The multi-layer interconnection circuit of claim 11 wherein the second direction is orthogonal to the first direction.

15. The multi-layer interconnection circuit of claim 11 comprising a plurality of planarized patterned polymer layers with each adjacent pair of the first and second conducting traces being at least partially separated by at least one of the planarized layers, each of the planarized layers including a contact window vertically aligned with the stacked contact and having a side wall that is continuously tapered.

16. The multi-layer interconnection circuit of claim 11, wherein the stacked contact directly contacts the base polymer layer.

17. The multi-layer interconnection circuit of claim 11, wherein an input/output pad metal layer is formed over and electrically connected to the stacked contact.

* * * * *